United States Patent
Wang et al.

(10) Patent No.: US 8,998,454 B2
(45) Date of Patent: Apr. 7, 2015

(54) FLEXIBLE ELECTRONIC ASSEMBLY AND METHOD OF MANUFACTURING THE SAME

(71) Applicants: Sumitomo Electric Printed Circuits, Inc., Koka, Shiga (JP); Power Gold LLC, Phoenix, AZ (US)

(72) Inventors: James Jen-Ho Wang, Phoenix, AZ (US); Jin Joo Park, Takarazuka (JP)

(73) Assignees: Sumitomo Electric Printed Circuits, Inc., Koka, Shiga (JP); Power Gold LLC, Phoenix, AZ (US)

( * ) Notice: Subject to any disclaimer, the term of this patent is extended or adjusted under 35 U.S.C. 154(b) by 118 days.

(21) Appl. No.: 13/835,634

(22) Filed: Mar. 15, 2013

(65) Prior Publication Data

US 2014/0268780 A1 Sep. 18, 2014

(51) Int. Cl.
| | |
|---|---|
| *F21V 29/00* | (2006.01) |
| *F21V 19/00* | (2006.01) |
| *F21K 99/00* | (2010.01) |
| *H05K 1/02* | (2006.01) |
| *H05K 3/30* | (2006.01) |

(52) U.S. Cl.
CPC ............. *F21V 19/003* (2013.01); *F21K 9/00* (2013.01); *F21K 9/90* (2013.01); *H05K 1/028* (2013.01); *H05K 3/306* (2013.01)

(58) Field of Classification Search
USPC .................. 362/294, 373, 249.02, 249.06
See application file for complete search history.

(56) References Cited

U.S. PATENT DOCUMENTS

| | | |
|---|---|---|
| 5,084,407 A | 1/1992 | Boland et al. |
| 5,860,585 A | 1/1999 | Rutledge et al. |
| 6,001,493 A | 12/1999 | Rutledge et al. |
| 6,646,347 B2 | 11/2003 | Sarihan et al. |
| 6,790,759 B1 | 9/2004 | Wang et al. |

(Continued)

FOREIGN PATENT DOCUMENTS

| | | |
|---|---|---|
| EP | 0 137 209 A2 | 4/1985 |
| KR | 10-2004-0066135 | 7/2004 |

(Continued)

OTHER PUBLICATIONS

"Patent Analysis: Flexible roll-to-roll preocessing," Solid State Technology, LED Manufacturing, Feb. 5, 2013 )2 pages).

(Continued)

*Primary Examiner* — Evan Dzierzynski
(74) *Attorney, Agent, or Firm* — Drinker Biddle & Reath LLP

(57) ABSTRACT

A flexible circuit assembly for accommodating a plurality of power electronic devices, including an insulating cover layer having first openings for power electronic devices, a flexible conductive layer arranged under the insulating cover layer and attached with a first adhesive to the insulating cover layer, an intermediate insulating layer arranged under the flexible conductive layer and attached with a second adhesive to the flexible conductive layer, the intermediate insulating layer having second openings, a plurality of heat-conductive elements arranged inside the second openings, a first thin heat sink layer, the heat-conductive elements arranged to be in contact with an upper surface of the thin heat sink layer and the lower surface of the islands via heat-conductive material; and a second thin heat sink layer, upper surfaces of the power electronic devices arranged to be in contact with a lower surface of the thin heat sink layer and the lower surface of the islands via heat-conductive material.

8 Claims, 12 Drawing Sheets

(56) References Cited

U.S. PATENT DOCUMENTS

| | | |
|---|---|---|
| 6,888,246 B2 | 5/2005 | Mercado et al. |
| 7,208,841 B2 | 4/2007 | Wang et al. |
| 7,524,731 B2 | 4/2009 | Wang |
| 7,615,866 B2 | 11/2009 | Wang et al. |
| 7,619,297 B2 | 11/2009 | Wang |
| 7,705,440 B2 | 4/2010 | Wang |
| 7,868,729 B2 | 1/2011 | Wang et al. |
| 8,153,510 B2 | 4/2012 | Wang |
| 2003/0102563 A1 | 6/2003 | Mercado et al. |
| 2003/0232493 A1 | 12/2003 | Mercado et al. |
| 2005/0023680 A1 | 2/2005 | Wang et al. |
| 2006/0108697 A1 | 5/2006 | Wang et al. |
| 2007/0275549 A1 | 11/2007 | Wang et al. |
| 2008/0079115 A1 | 4/2008 | Wang |
| 2009/0065904 A1 | 3/2009 | Wang |
| 2009/0152676 A1 | 6/2009 | Wang |
| 2009/0207630 A1* | 8/2009 | Satoh et al. ............ 362/615 |
| 2010/0015793 A1 | 1/2010 | Wang et al. |
| 2010/0214777 A1* | 8/2010 | Suehiro et al. ............ 362/235 |
| 2010/0225434 A1 | 9/2010 | Wang et al. |
| 2010/0279489 A1 | 11/2010 | Wang |
| 2010/0301452 A1 | 12/2010 | Wang |
| 2012/0061796 A1 | 3/2012 | Wang |
| 2012/0320532 A1 | 12/2012 | Wang |

FOREIGN PATENT DOCUMENTS

| | | |
|---|---|---|
| KR | 10-2006-0054382 | 5/2006 |
| KR | 10-2009-0009890 | 1/2009 |
| WO | WO-03/049178 A2 | 6/2003 |
| WO | WO-2005/013319 A2 | 2/2005 |
| WO | WO-2007/140049 A2 | 12/2007 |
| WO | WO-2012/173654 A2 | 12/2012 |

OTHER PUBLICATIONS

Joachim N. Burghartz, "Flexible Silicon Chips: Thin, pliable organic semiconductors are too slow to serve in tomorrow's 3-D chips," Mar. 2013 (7 pages).

Redefining the Geometry of Light, Cooledge Lighting Brochure, www.cooledgelighting.com/sites/default/files/colledge-lighting-brochure.pdf (4 pages).

U.S. Appl. No. 61/497,472, filed Jun. 15, 2011.

U.S. Appl. No. 61/630,536.

U.S. Appl. No. 61/693,195.

U.S. Appl. No. 13/835,845, filed Mar. 15, 2013.

\* cited by examiner

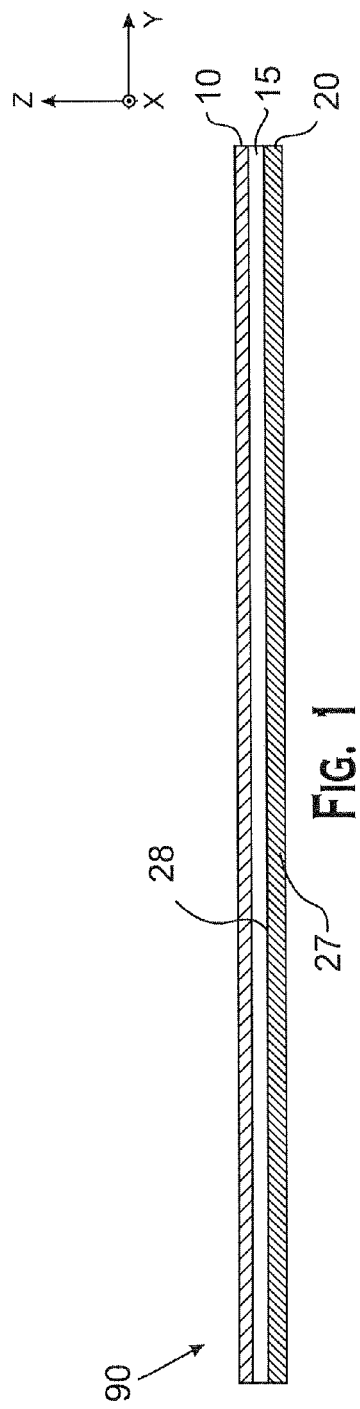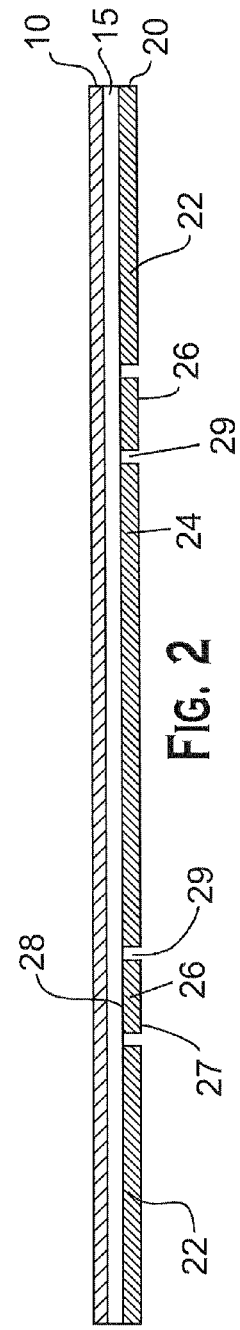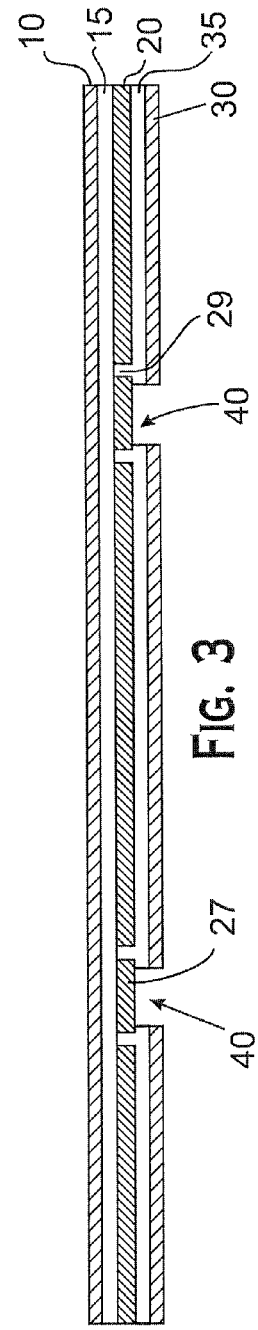

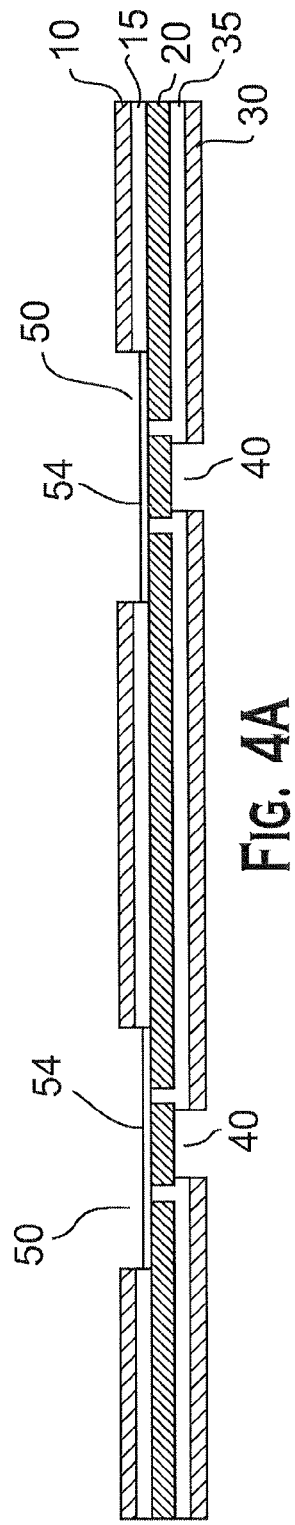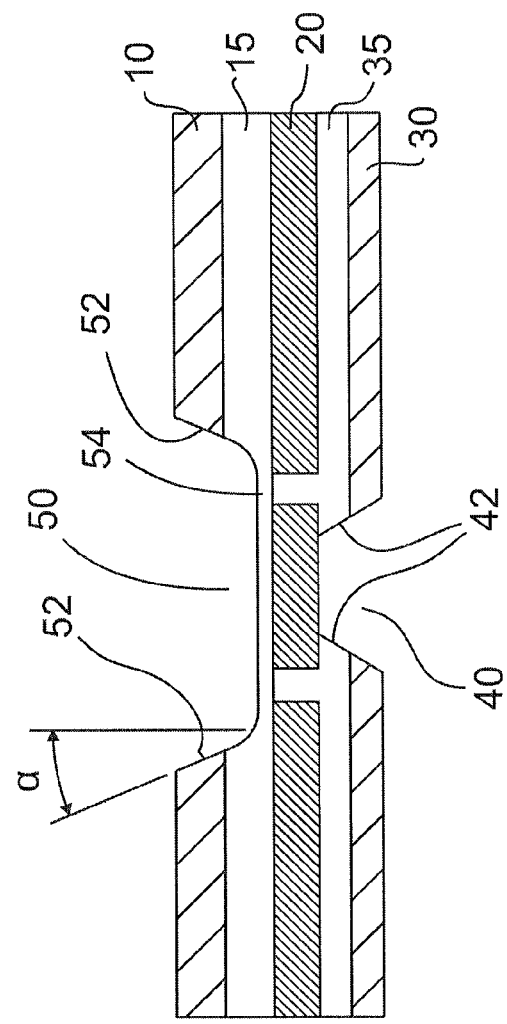

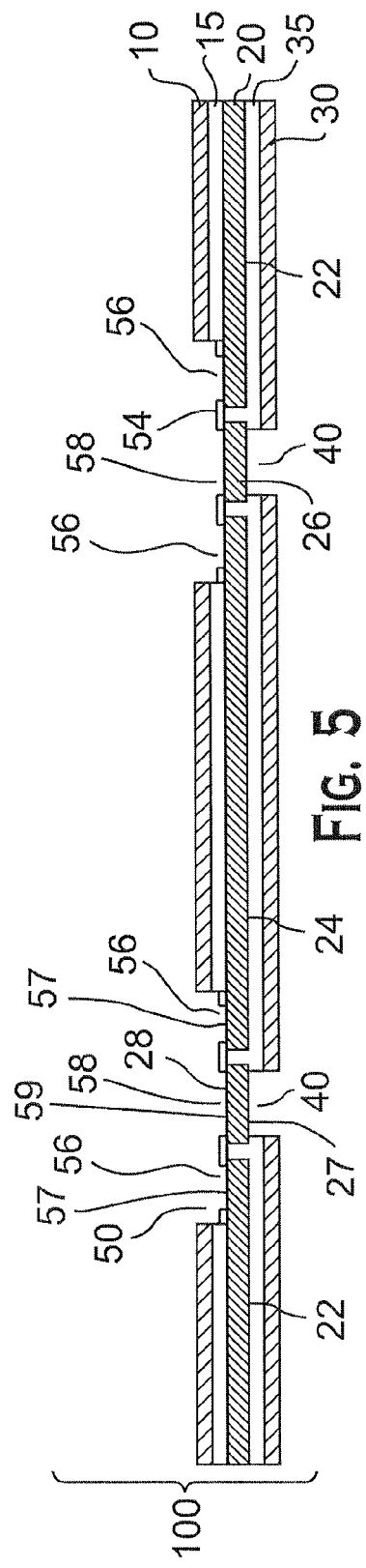
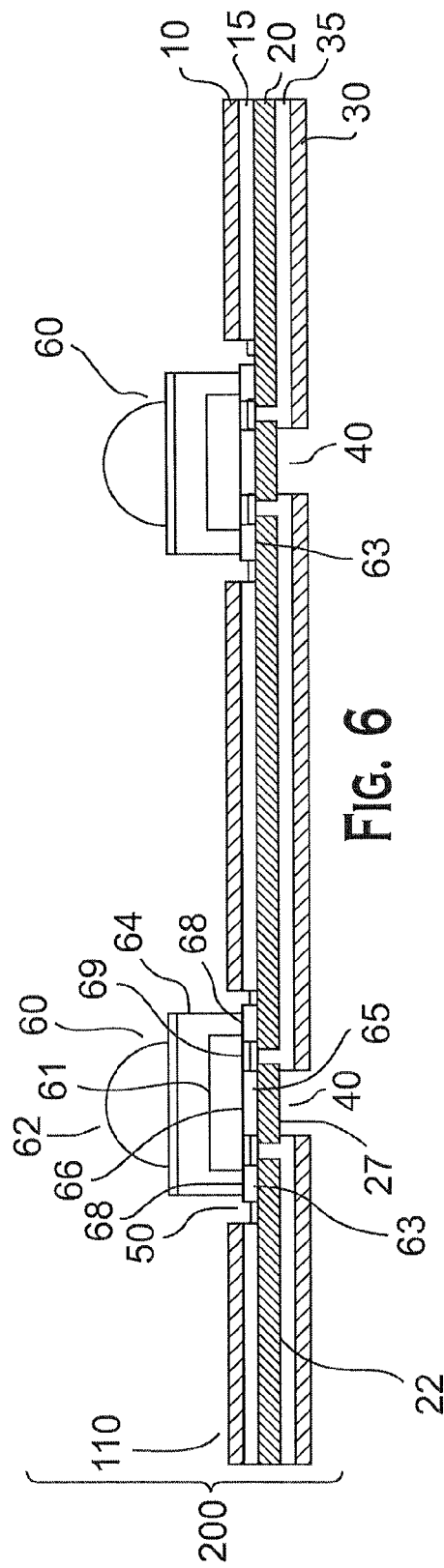

FLEXIBLE ELECTRONIC ASSEMBLY AND METHOD OF MANUFACTURING THE SAME

TECHNICAL FIELD OF THE INVENTION

The present invention relates generally to flexible printed circuit assemblies that can be bent and rolled (including flexible printed circuit assemblies that comprise power electric devices), a method of embedding such power electronic devices into flexible printed circuits of the flexible printed circuit assemblies, and a method of providing an automatic manufacturing process to generate bendable and rollable power electronic assemblies.

BACKGROUND OF THE INVENTION

Flexible printed circuits and rigid-flexible printed circuits are used in many applications where at least certain parts of the circuits need to be installed in a bent state. Flex circuitry incorporates metal lines sandwiched between non-conductive flexible layers of the flexible printed circuit. However, as more layers of metal and non-conductive substrates are added to the sandwich, the flexible printed circuit becomes less flexible. In addition, attempts to add electrical or electronic devices require the mounting of components onto the surfaces of the flexible circuit. The surface mounted components, i.e., surface mounted devices (SMDs), make the flexible circuit assembly even more rigid and less flexible, and substantially increase the height of the flexible circuit assembly.

Electronic systems are often separated onto two or three circuit boards. Rigid printed circuit boards (PCBs) are used to mount and support the electronic devices and include many copper layers to interconnect the respective SMDs. Separate flexible interconnects are used to provide interconnection between the individual rigid PCBs. Also, the flexible circuits are typically structured with two or more metal layers. Thus, the system is somewhat flexible in the interconnect flex circuit regions, but rigid where components are mounted. As a result, the multi-component system is not optimized for size and weight parameters. Furthermore, the combined PCB-flex manufacturing processes are complex and expensive. Rigid flex technology employs methods to thicken and stiffen a region of the flexible circuit to provide a region that is mechanically rigid to accommodate fragile components, e.g., surface mount devices and through-hole connectors. The process for mounting SMDs is likewise complex and less cost effective. For example, over-molding of devices such as semiconductor circuits, requires additional assembly and packaging process steps. Devices are diced from a wafer to form a die are first assembled into a packaged device, and the packaged device is then soldered onto a PCB to complete assembly.

In addition, the aforementioned PCB substrates, rigid-flex substrates, and flexible substrates are poor conductors of heat. Therefore, when heat generated by the mounted device is excessive, e.g., in the case of power circuits, microprocessors, and light-emitting devices, more expensive thermally conductive substrates accompanied with the attachment of a bulky conducting heat sink are required. Without the attachment of such heat sinks, many devices, especially power devices and microprocessors, cannot be fully tested. The heat sink is attached to the underside of a metal core (MC) substrate, MC-PCB, or on top of the packaged SMD to transfer heat away from the mounted device. The heat sink is typically metallic copper or aluminum fins and its attachment to the substrate or package makes the assembly bulky, heavy, and very inflexible. In addition, FR4 and adhesive materials that are conventionally used for PCBs cannot be processed above 270° C. and higher melting, lead-free solders require bonding at higher temperatures that can decompose FR4 and the adhesive material. Also, FR4 is made of toxic materials and cannot be used for implant electronics, such as pacemakers.

Moreover, for electro-magnetic shielding of the aforementioned PCB substrates, rigid-flex substrates, and flexible substrates for electromagnetic interference (EMI) protection, additional metal casings around these PCBs are used that add increased cost, weight, and inflexibility to the electronic systems, and can also further decrease the extraction of thermal energy from the circuits, and may require additional sophisticated heat sink structures.

Therefore, despite all the existing flexible circuit technology, in light of the above deficiencies of the background technology, what is needed is an adaptable and cost-effective method of manufacturing flexible circuit assemblies that permits mounting of an increased number of power devices in a cost effective weight and space saving manner, transfers heat efficiently away from heat generating devices, and allows the use of highly effectual automated roll-to-roll manufacturing concepts.

SUMMARY OF EMBODIMENTS OF THE INVENTION

According to a first aspect of the present invention, a flexible circuit assembly for accommodating a plurality of power electronic devices is provided. Preferably, the flexible circuit assembly includes an insulating cover layer having first openings, the first openings configured to receive the plurality of power electronic devices at least partially inside the first openings, a flexible conductive layer arranged under the insulating cover layer and attached with a first adhesive to the insulating cover layer, the flexible conductive layer having a plurality of islands and conductive traces, the first openings arranged above the islands, and an intermediate insulating layer arranged under the flexible conductive layer and attached with a second adhesive to the flexible conductive layer, the intermediate insulating layer having second openings, the second openings arranged below the islands. Moreover, the flexible circuit assembly preferably further includes a plurality of heat-conductive elements arranged inside the second openings, a first thin heat sink layer, the heat-conductive elements arranged to be in contact with an upper surface of the thin heat sink layer and the lower surface of the islands via heat-conductive material, and a second thin heat sink layer, upper surfaces of the power electronic devices arranged to be in contact with a lower surface of the thin heat sink layer and the lower surface of the islands via heat-conductive material, wherein the flexible circuit assembly is bendable to a bending radius of 3 cm without cracking the insulating cover layer, the flexible conductive layer, the intermediate insulating layer.

According to another aspect of the present invention, a flexible circuit assembly for accommodating a plurality of light emitting diodes is provided. Preferably, the flexible circuit assembly includes an insulating cover layer having first openings, the first openings configured to receive the plurality of light emitting diodes at least partially inside the first openings, a flexible conductive layer arranged under the insulating cover layer and attached with a first adhesive to the insulating cover layer, the flexible conductive layer having a plurality of islands and conductive traces, the first openings arranged above the islands, and an intermediate insulating layer arranged under the flexible conductive layer and attached with a second adhesive to the flexible conductive layer, the intermediate insulating layer having second openings, the second openings arranged below the islands. In addition, the flexible circuit assembly preferably also includes a plurality of heat-conductive elements arranged inside the second openings, and a thin heat sink layer, the heat-conductive elements arranged to be in contact with the upper surface of the thin heat sink layer and the lower surface of the islands, wherein the flexible circuit assembly is bendable to a bending radius of 6 cm without cracking the insulating cover layer, the flexible conductive layer, the intermediate insulating layer.

According to yet another aspect of the present invention, a method of forming a flexible printed circuit is provided, having a light emitting device attached thereto. Preferably, the method includes the steps of providing a flexible printed circuit having a flexible conductive layer, an insulating cover layer, and an intermediate insulating layer, the flexible conductive layer arranged between the insulating cover layer and the intermediate insulating layer, the flexible conductive layer having connection portions and an island, the island being electrically isolated from the connection portions, a second opening being provided in the intermediate insulating layer to expose the island of the conductive layer from a lower side, forming a first opening in the insulating cover layer without entirely removing a residual film on top of the flexible conductive layer, and forming third openings in the residual film to expose upper surfaces of the connection portions and the island. Moreover, the method further preferably includes the steps of placing the electronic device in the second opening; attaching the electronic device with a connection material via the third openings in the residual film to the connection portions and the island; filling the first opening with an encapsulant; filling the second opening with a thermal conductive material; and forming a heat conductive layer on below the intermediate insulating layer and connecting the heat conductive layer to the thermal conductive material.

BRIEF DESCRIPTION OF THE SEVERAL VIEWS OF THE DRAWINGS

The accompanying drawings, which are incorporated herein and constitute part of this specification, illustrate the presently preferred embodiments of the invention, and together with the general description given above and the detailed description given below, serve to explain features of the invention.

FIGS. 1-7 depict stages in a method of processing a flexible printed circuit tape to make a flexible printed circuit assembly, showing side cross-sectional views of the flexible printed circuit tape after different processing steps according to a first aspect of the present invention;

Herein, identical reference numerals are used, where possible, to designate identical elements that are common to the figures. Also, the images in the drawings are simplified for illustration purposes and may not be depicted to scale.

DETAILED DESCRIPTION OF EMBODIMENTS OF THE INVENTION

Figure 7:
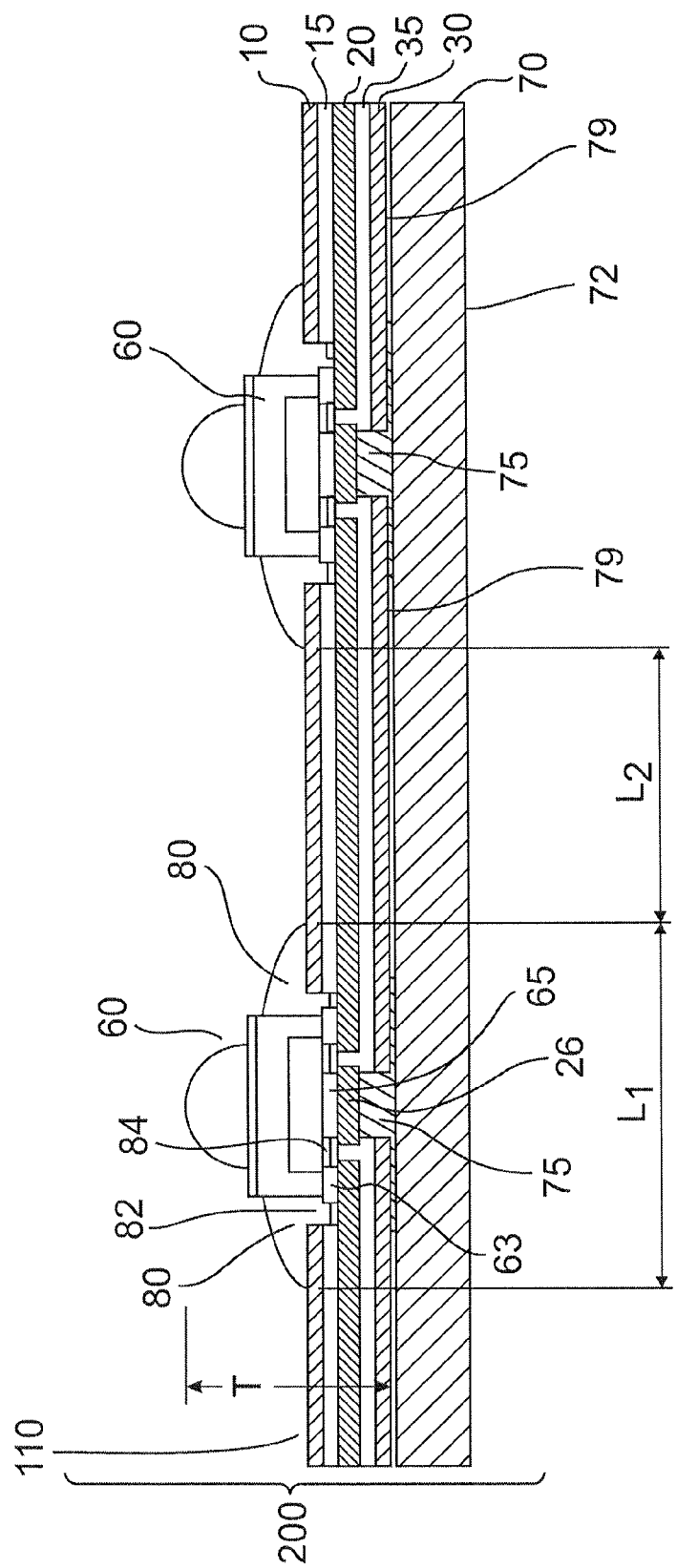

FIGS. 1-7 show side cross-sectional views of an assembly in different stages of processing an unprocessed or pre-processed flexible printed circuit tape 90 that can be in form of a continuous tape with the goal of obtaining a flexible printed circuit assembly 200 (shown in FIG. 6) according to a first aspect of the present invention. For descriptive purposes, the description below makes references to an x, y, and z Cartesian coordinate system for example as depicted in FIG. 1 for orientation and descriptive purposes only, in which the y-direction is defined by the longitudinal extension of tape 90, the x-direction the width extension of tape 90, and the z-direction is defined as being a direction that is perpendicular to an exposed surface of the first insulating layer 10 of tape 90. In this respect, the negative y-direction is referred to as the left side, while the positive x-direction is referred to as the right side, and upper and top surfaces are surfaces that are exposed towards the z-direction, while lower and bottom surfaces are surfaces that are exposed towards the negative z-direction, for descriptive purposes only. Also, the dimensions of the figures have been chosen for illustration purposes only, and may not be depicted to scale. The pre-processed flexible printed circuit 90 is not limited to a continuous tape, it can also be a part of a tape, panel format, or other formats.

First, as shown in FIG. 1, a single-sided flexible printed tape 90 is provided, made of a first insulating layer 10 having a thickness of 13 μm and a conductive layer 20, for example made of copper (Cu), having a thickness of 71 μm, the first insulating layer 10 and the conductive layer 20 being attached to each other by an adhesive layer 15, for example a layer of epoxy glue having a thickness of 25 μm. As an alternative, a tape 90 can be used without adhesive layer 15, but with first insulating layer 10 and conductive layer 20 directly attached to each other, especially in high-temperature applications. For example, first insulating layer 10 can be made of polyimide such as Kapton™, or other materials having excellent dielectric capabilities, for example, but not limited to, polyester-imide, liquid crystal polymer (LCP). Also, polyimide and LCP are inert materials, and polyimide is permitted to be used for implant electronics, for example, but not limited to pace makers, cochlear implant hearing aids, drug dispensers. Conductive layer 20 can be made of other materials than Cu, whether metallic or non-metallic, as long as the material used shows not only very good electrical conductivity but also thermal conductivity, for example aluminum. Thicknesses chosen for conductive layer 20 and insulating layers 10 and 15 can depend on application. Preferably, flexible printed circuit tape 90 is a continuous tape having a length of several meters or more that can be rolled and bent for roll-to-roll automated manufacturing. Also, it is possible that flexible printed tape 90 is a sheet having a width of 300 mm.

For manufacturing electronic devices spanning a large surface, for example oversized light-emitting display screens, wider sheets can be processed by combining adjacent tape equipment tools to process tape 90. In this stage, upper surface 28 of the conductive layer 20 is covered by the adhesive layer 15, and a lower surface 27 of the conductive layer 20 is exposed. First insulating layer 10 may be made of a photo-imageable polyimide, and may or may not have been previously patterned by a photomask for photolithography (not shown) so that, in a later step, patterned portions can be removed by wet etching from first insulating layer 10 to form openings.

Next, as shown in FIG. 2, the conductive layer 20 is processed so as to form grooves, cavities, or trenches 29, for example by patterning and etching the conductive layer to form a plurality of connection traces 22 and islands 26, for example by using photolithography techniques for generating very fine pitches from the conductive layer 20. The connection traces 22 may be configured to form electrical connections 24 for electrical signals and electric power supply, while the islands 26 are arranged such that they are electrically isolated from at least some of the connection traces 26 serving to evacuate thermal energy. Dry etching can be used to remove conductive layers 20 made of Al. Moreover, after forming grooves 29 that expose surface of adhesive layer 15, it is possible to perform electroplating to increase a thickness of conductive layer 20, and also to make grooves 29 narrower.

Thereafter, another film consisting of adhesive layer 35, for example a Coverlay adhesive made of an epoxy material having a thickness of 25 μm, and a second insulating layer 30, for example a Coverlay layer made of a Polyimide such as Kapton™, or a Polyimide composite resin having a thickness of 12 μm, is first router cut, stamped or laser cut to create second openings 40. After cutting out second openings 40, second insulating layer 30 and conductive layer 20 are aligned and laminated under roller pressure and exposed to at least one of ultraviolet (UV) light exposure and heating. As shown in FIG. 3, second openings 40 are located in the second insulating layer 30 and adhesive layer 35 such that the lower surface 27 of the islands 26 are exposed. Lower surface 27 of islands 26 can also be cleaned to remove any adhesive or oxidation that might have been formed. Preferably, the conductive layer 20 is chosen to be thicker than the first and second insulating layer 10, 30 and adhesive layers 15, 35. Moreover, 2 oz (71 μm) or 1 oz (36 μm) copper layers can be used for conductive layer 20, and for low-current signal paths copper with a thickness of ¼ oz (9 μm) can be used.

As shown in the stage depicted in FIG. 4A, first openings 50 have been formed. In the variant shown, first openings 50 are formed after the second insulating layer 30 and conductive layer 20 are attached to each other. First openings 50 are preferably made such that during the formation process, first (i) the entire thickness of the first insulating layer 10 is removed, and then (ii) only a part of the adhesive layer 15 is removed so that a residual film 54 from adhesive layer 15 remains that still entirely covers the upper surface of conductive layer 20. For example, removal of first insulating layer 10 and adhesive layer 15 to form first openings 50 can be done by controlled and laser ablation, laser skiving or laser etching to preserve the residual film 54, and then forming third and fourth openings 56, 58 by a second step of laser ablation, laser skiving or laser etching of the remaining adhesive layer 15 forming residual film.

This residual film 54 preferably has a thickness in the range between 5 μm and 10 μm. For example, the residual film 54 could have the thickness of half the adhesive layer 15. This allows maintenance of the structural integrity of the previously formed adhesive layer 15 for making the residual film 54 so that it can serve as a solder mask or solder darn to prevent short circuits between pads formed by conductive layer 20 from the Tin (Sn) whiskers formation, and also provides for a good dielectric insulation. Also, this method step allows saving costs and manufacturing time as compared to a method where the residual film 54 has to be formed by a separate process step. Residual film 54 and adhesive layer 15 can be made of polyimide that can be wet etched for creating fine pitch solder dams, or by developing a photo-imaginable polyimide, that is coated when being in a liquid state, ultraviolet (UV) exposed, developed and then baked to cure polyimide. Residual film with third and fourth openings 56, 58 can form solder dams with a pitch around 100 μm and less, for example suitable for but not limited to flip-chip bumps, pillar bumps, AuSn TAB bonding, attach for fine package leads.

In a variant, as shown in FIG. 4B, first openings 50 are formed such that the side walls 52 are beveled, having in average angle α between 30° and 60°. The formation of the beveled sidewalls 52 can be accomplished when using a wet etching technique that does not create vertical side walls.

Preferably, wet chemical etching techniques are used to form the sloped profile or beveled side walls 52, however, laser ablation techniques with a large diameter spot laser beam can also create such sloped profile. These beveled side walls 52 of first openings 50 can be useful for aiding a precision and accuracy of a pick-and-place process, in which components are placed into first opening 50, as further explained below. Because chip shooters are fast and do not place components with a high degree of accuracy as compared to bare die pick-and-place tools, beveled side walls 52 allow components 60 or dies 61 to slide into the negative z-direction into its final location in second opening 50, and in a case where the component is not sufficiently aligned with its x and y position of the final place, the beveled side walls 52 will act as a guide and will move the component towards the correct place.

In a variant, no adhesive layer 35 is present, in particular for high temperature applications where temperatures above 175° C. are used, because epoxy-based adhesives can decompose. Therefore, adhesiveless film and processes are more suitable for operating above 175° C. For example, adhesiveless second insulating layer 30 can be directly coated onto the surface of the conductive layer 20 as a liquid polyimide, and can be photoimageable. Photoimageable polyimide film serving as second insulating layer 30 can be sensitive to UV light and can be exposed and developed out just like positive photoresist. After coating and soft bake, second openings 40 can be UV exposed through photomask, second openings 40 in polyimide material is etched out with developer chemical and then polyimide is fully cured. First insulating layer 10 can be formed and processed analogously, without adhesive layer 15.

Thereafter, in the stage shown in FIG. 5, third and fourth openings 56, 58 have been formed into residual film, the third openings 56 being located at positions where an electric connection to conductive traces 24 is required, and the fourth openings being located at positions above islands 26 for thermal heat evacuation. Thereby, at least a portion of the upper surface 57 of conductive traces 22, 24 and upper surface 59 of islands 26 are exposed. Preferably, third and fourth openings 56, 58 are formed by a laser ablation process, and a laser is used that is configured to be absorbed by the material that forms the adhesive layer 15, but minimizes ablation of conductive layer 20. In a variant it is also possible that the entire upper surface 59 of islands 26 is exposed to maximize the usable surface of islands 26 for further improved thermal heat evacuation. Next, a step of cleaning the upper surfaces 57, 59 can be performed, to remove residue of adhesive or to remove oxidation, as necessary. After first openings 50, third openings 56, and fourth openings 58 are formed and developed by a photolithography process, it is possible to make structures down to a small pitch such as 35 μm pitch, allowing one to generate connections for very small bare die or packages. In another variant, photoimageable, UV-sensitive polyimide is used instead of Kapton™.

In a variant, it is also possible that first openings 50 are formed to remove all of the material of first insulating layer 10 and adhesive layer 15 down to upper surface 28 of conductive layer 20, and then the residual film 54 is formed separately made of a material having good solder resists and high voltage insulating properties, for example by a deposition process. This stage of the method provides for a flexible printed circuit 100 that can be rolled to a certain bending radius, preferably down to a range of 30 mm to 50 mm, so that a resulting flexible printed circuit 100 can be easily packaged, shipped and delivered to a different processing factory. For example, Kapton™ films from the DuPont company are understood to be delivered on rolls having a diameter of 76 mm to 152 mm. FIG. 5 shows flexible printed circuit 100 with only two first openings 50 for two components 60 along the y-direction; however, it is possible that many more first openings 50 for components can be formed having different dimensions, arranged along both the x-direction and the y-direction.

FIG. 6 shows another stage of the method, where component 60, a power electronics component for example but not limited to a diode or a transistor, has been placed at least partially into first opening 50 to be embedded into flexible printed circuit (FPC) 110. Before placing component 60 into the opening, solder paste can be dispensed into third openings 56 and fourth openings 58. Residual film 54 with third and fourth openings 56, 58 serves as a solder resist layer or solder dam. Alternatively, an electrical conductive adhesive material can be deposited into third and fourth openings 56, 58. For example, a thermally conductive material, for example thermal conductive adhesive such as an epoxy die attach with silver (Ag) particles for electrical and thermal conduction, can be introduced into third openings 56, and a different epoxy die attach with boron nitride (BN) fillers that is thermally conductive but electrically insulating can be introduced into fourth openings 58.

In FIG. 6, component 60 is packaged light emitting diode (LED), however FIG. 6 variant shows an unpackaged LED bare chip 61 that is placed into second opening 50. In case an unpackaged bare die 61 or chip is used, by using direct-attach (DA) technology, the lead frame packaging components for die 61 are not necessary, because functional equivalent traces and fan-out can be provided by the finely patterned conductive layer 20. For connections 63, 65 to die 61, pillar bumps may be used. This allows reduction of space required, such as the height, and costs by eliminating packaging material for the lead frame and the casing, by eliminating manufacturing steps, and by making a space required for component integration smaller, for example first openings 50. Also, tall connections 63 and 65 serve as an interposer to absorb mechanical stresses, and these mechanical stresses tend to be lower if a much smaller die 61 is placed into first opening instead of a much larger packaged component 60. Moreover, it is also possible to embed thin chips 61 into first opening 50 that are bendable themselves, for example by placing organic chips or ultra-thin silicon chips into opening 50. Ultra-thin chips can preferably have a thickness in a range of 15 μm to 50 μm, instead of conventional chips having a thickness of 375 μm. For example chips made of Chipfilm™ technology of IMS Chips could be used.

It is also possible that passive components may be embedded as described above, for example but not limited to resistors, inductors, and capacitors, or active devices for example but not limited to sensors, micro-actuators, laser diodes, transistors, Schottky diodes, fuses.

Lower surface 69 of component 60 has terminals 68 that are used for electrical connection with conductive traces 22 via solder connections 63 to provide electric energy and signals, but can also be used as thermal connections. Moreover, lower surface 69 of component 90 also has an interconnection element 66, for example a metallic surface, that allows to safe attachment of component 60 to islands 26 via connection 65, but also to effectively evacuate thermal power or heat from component 60. In the example shown, to effectively remove thermal power or heat from component 60, a surface area of interconnection element 66 is much larger that a surface area of terminals 68, and can cover a large part of the entire lower surface of component 60.

Flux and solder paste can be placed into third and fourth openings 56, 58. Next, component 60 is then placed into first opening 50 by a flip-chip pick-and-place machine, tape automated bonding (TAB), or by a regular SMD pick-and-place process. Flip-chips will have solder bumps corresponding to openings 56, 58. Flip-chip dies 61 are tacked on and then reflowed to form metallic joints between bumps and conductive layer 20.

TAB chips may have gold-tin bumps corresponding to third and fourth openings 56, 58, and upper surfaces conductive traces 22 and islands 26 are first plated with Nickel-Gold (NiAu) or Nickel-Palladium-Gold (NiPdAu). TAB bonding is performed at temperatures up to 340° C. where eutectic Gold-Tin (AuSn) bonds are formed during bonding. Flexible printed circuit 100 must be suitable for these high-temperature processes by choice of materials and processes. For high-temperature operation, first and second insulating layers 10, 30 can be made of high-temperature polyimide, polyester, liquid-crystal polymer, Teflon™, to achieve operating temperatures above 250° C. and process and assembly temperatures up to 380° C.

The embedding of packaged components allows one to use existing SMD machinery for this step. Next, component 60 is preferably soldered to conductive layer 20 by reflow soldering or another soldering technique, to form connections 63 and 65, preferably by using a solder having a high-temperature melting point. In this step, solder that is located in third openings 56 will solder upper surface 57 of conductive traces 22 to terminals 68 of component 60 to form an electric connection and mechanical bond by connection 63, and solder located in fourth openings 58 will solder upper surface 59 of islands 26 to interconnection element 66 of component 60 to form a thermal connection and mechanical bond by connections 65. If component 60 were an unpackaged die or chip and then a very short thermal path and low thermal resistance from a location at the die 61 where the power is dissipated towards islands 26 is created. Due to the relative thinness of films 30 and 35, this design greatly increases heat removal from component 60 or die 61, and is therefore particularly suitable for power devices having high power dissipation and low pin number, such as but not limited to light emitting diodes, diodes, transistors, resistors, super capacitors, silicon-controlled rectifiers (SCR), Insulated Gate Bipolar Transistors (IGBTs) and variations and combinations thereof, such as Gallium Arsenide, GaN, SiC devices, variacs, triacs, laser diodes, film batteries, and fuses. However, it is also possible to embed components 60 that are not power devices, such as but not limited to antennas, sensors, and Microelectromechanical systems (MEMS).

Next, FIG. 7 shows another stage in the method in which at least some remaining spaces of first openings 50 that are not occupied by the component 60 are filled with encapsulant 80. Thereby, it is possible that spaces 82 between first insulating layer 10 and adhesive layer 15 and side walls of component 60 are filled with encapsulant 80 for adhesive purposes and to reduce potential bending stresses. Encapsulant 80 can be made of a material that has a Young's modulus that is higher than the Young's modulus of assembly 200 without component 60 once it is ready for usage, for example after it has been hardened or cured, which means that the encapsulant 80 will be stiffer than the assembly 200 at each location $L_2$ where no components are arranged. With this arrangement, locations $L_1$ where the components 60 and encapsulant 80 are arranged will be stiffer than locations $L_2$ where no components are arranged on the assembly 200 when bending occurs in the z direction.

Because many of the components 60 that will be embedded are very stiff, the use of such encapsulant 80 reduces bending at $L_1$ so that the region at $L_2$ will bend more than region $L_1$. Large difference in stiffness within the less bendable $L_1$ region can be problematic. Without an encapsulant 80, the smallest bending angle would naturally occur at the locations of spaces 82 when assembly 200 is bent, and this could lead to locally high bending stresses that could cause delamination of layers or detachment of components 60 from circuit 100. Preferably, a Young's modulus of the encapsulant 80 will be in the range of 1-20 GPa. However, in a variant, especially when components 60 having a smaller width or length that is exposed to the bending surface, it is also possible that the Young's modulus of encapsulant 80 matches the Young's modulus of the component package or bare die 61. The stiffness of encapsulant 80 can be adjusted by using filler particles, such as $SiO_2$. Diamond or Boron Nitride fillers can also be used. Encapsulant material 80 can be silicone, epoxy, cyanoacrylate, or polyimide. Moreover, the encapsulation can be done in a two-step process, in which, first, a first encapsulating material is dispensed between component 60 or die 61 and the flexible printed circuit 100. Next, second encapsulating material can be dispensed over component 60 or die 61 to stiffen the area where components 60 and the corresponding second opening 50 are placed. The use of this two-layer encapsulation allows one transition of the stresses from bendable region $L_2$ to lower bending device region $L_1$ for a smooth transition of stiffness, so that bending and flexing action does not damage the connections of component 60 with flexible printed circuit 100. Furthermore, to increase thermal conductivity, then special fillers having higher thermal conductivity than silica particles such as boron nitride (BN), diamond, alumina or other ceramics can be used.

Also, this stage of the method shows spaces 84 in FIG. 7 that are located beneath lower surface 69 of component 60 between connections 63 and connections 65 that can be filled by a separate underfill material. The underfill material chosen preferably has good dielectric properties for high-voltage insulation, high temperature resistance, good thermal conductivity, and has a Young's modulus that is lower than the rest of circuit 100 after hardening. Therefore, the underfill material in narrow spaces 84 does not add stress to sensitive components and helps to absorb mechanical stresses onto device 60. Underfill materials that can be used include Henkel Loctite™, Namics™ Flip Chip Underfill, Masterbond epoxy, or Hitachi-DuPont low-curing, high-operating temperature polymers. With this stage of the method, a packaged component 60 or a bare die 61 is at least partially embedded into the flexible printed circuit 100, and is not surface-mounted onto an outer layer of a printed circuit board, as done conventionally. This allows reduction of the overall thickness of the flexible printed circuit assembly 200. Also, due to the direct connection of a heat dissipating surface in the form of interconnection element 66 of component 60 with a heat sink structure as discussed below, heat dissipation for the electronic device 60 through the flexible printed circuit 100 is greatly improved. Also, compared with flexible printed circuits having surface-mount components, bending stresses are substantially reduced and the allowable bending angle is increased.

Also, FIG. 7 shows a stage in the method in which thermal conductive layer 70 has been attached to flexible printed circuit 100 via second insulating layer 30. Thermal conductive layer 70 is preferably made of metal, for example Aluminum (Al), and is mechanically and thermally connected to islands 26 with a thermal connection 75, preferably made of thermal grease or thermally conductive adhesive. Thermally conductive layer 70 can be of other materials but not limited to steel, glass, cloth, laminate, composite. In the variant shown, the thermal conductive layer 70 is shared by components 60, and serves as a common heat sink for dissipating thermal energy for all of the components 60, but can also serve as a surface for attaching flexible printed circuit assembly 200 to another structure. To attach thermal conductive layer 70 to circuit 100, second openings 40 are filled with material that forms the thermal connection 75, so that the material overfills the second opening 40. Next, thermal conductive layer 70 is pressed against second insulating layer 30 so that the material for thermal connections 75, at that time moment in a fluid state, is spread out in x- and y-directions to form a thin film between second insulating layer 30 and thermal conductive layer 70 outside second opening 40. While a contact surface between thermal connection 75 and islands 26 remains the same, this spreading of the thermally conductive material allows an increase in the contact surface between thermal connections 75 and thermal conductive layer 70. Air pockets and voids can be reduced and eliminated to further reduce thermal resistance between these two elements. In a variant, it is also possible that multiple assemblies 200 arranged in a tape are first subject to cutting, and then thermal conductive layer 70 is attached. Viscosity of the greases varies from 10,000 cps to 200,000 cps. Greases can increase in viscosity after wetting and application to minimize pump-out effect.

Also, at locations between heat sink layer 70 and second insulating layer 30 other than thermal connections 75 in areas $L_2$, an additional adhesive layer 79 can be arranged, for permanent attachment of circuit 100 to heat sink layer 70. Adhesive layer 79 can surround areas having thermal connections 75 so that the thermal grease that is not adhesive and remains in a fluid state, is contained to the locations of thermal connections 75. This feature also allows reduction in bending stresses, since no adhesive layer 79 is arranged at the location in the x and y-direction of components 60 or dies 61, but still close to these areas to avoid separation between circuit 100 to heat sink layer 70. Also, because circuit 100 has low modulus and is very thin relative to heat sink layer 70, the circuit 100 will flex stretch and compress, while heat sink layer 70, for example made of Al, bends, expands and shrinks but the thicker heat sink materials are low compliant.

Depending on the application, different types of material can be used for thermal connections 75. For example, in a case where assembly 200 will be subjected to repetitive and frequent bending, preferably a thermal grease is used for thermal connections 75, or another thermally-conductive material that retains a certain fluidity and does not fully harden, and that has little or no adhesive properties. In this way, the thermal connection between thermal conductive layer 70 and islands 26 with thermal connections 75 can be maintained despite the bending because the contact surfaces can slide and yet avoid delamination or formation of air gap, as long as pressure between thermal conductive layer 70 and second insulating layer 30 is maintained. In a case where assembly 200 will be subject to a one-time bending before being fixedly installed, for example when the assembly too will be installed only once onto a curved surface, the material for thermal connections 75 can be an adhesive that can be hardened, for example but not limited to, an epoxy or silicone based thermal adhesives.

Lower surface 72 of thermal conductive layer 70 serves to dissipate thermal energy that has been generated at the die 61 to the environment. Heat will also dissipate from an upper surface of assembly 200. Lower surface 72 of thermal conductive layer 70 can also be specially treated to better dissipate the thermal energy, for example, it can be roughened or be subjected to matrix-like microchannels or grooves, or patterns, to increase the heat-dissipating surface, or anodized in a less shiny color tone that improves radiation of the heat into ambient air or space. Preferably, the thermal conductive layer 70 is selected to have a thickness that preserves flexibility of the assembly, so that a minimal allowable bending radius in a range of 5 cm-18 cm can be achieved. Before attachment of components 60 or dies 61, the flexible printed circuit 100 can be bent to lower radii, as discussed above. In addition, overall thickness T of assembly 200 using a packaged component 60 is maintained below a certain value, i.e. below 2.3 mm. In an exemplary embodiment, a thickness of thermal conductive layer 70 is in a range between 50 and 500 μm. If assembly 200 will be subject to continuous bending, the thickness of thermal conductive layer 70 is chosen to be smaller, for example below 270 μm. For one time bending, thermal conductive layer can be made much thicker. Thinner layers improve bendability, but may reduce capabilities of thermal spreading and may be more fragile. Although smaller bending radii can be theoretically accomplished with assembly 200, it is to be understood that this bending radius is defined to have a value such that assembly 200 still preserves electrical and mechanical integrity, without cracking the insulating cover layer or first insulating layer 10, the flexible conductive layer 20, the intermediate insulating layer or second insulating layer 30, and without any of components 60 detaching from connections 63, 65, connections 65 detaching from islands, or connections 63 detaching from connection traces 22 without damaging device nor cracking of solder joints and bumps, once assembly 200 is subject to bending. Aluminum (Al) material is preferred for heat sink layer 70, because Al is light-weight and has low thermal resistivity and good electrical conduction, so that it can serve as an excellent heat spreading device, as Faraday shield and also serve as a ground plane. However, in a variant, circuit 100 is directly attached to a pre-existing heat sink structure, as further discussed below.

Figure 8:
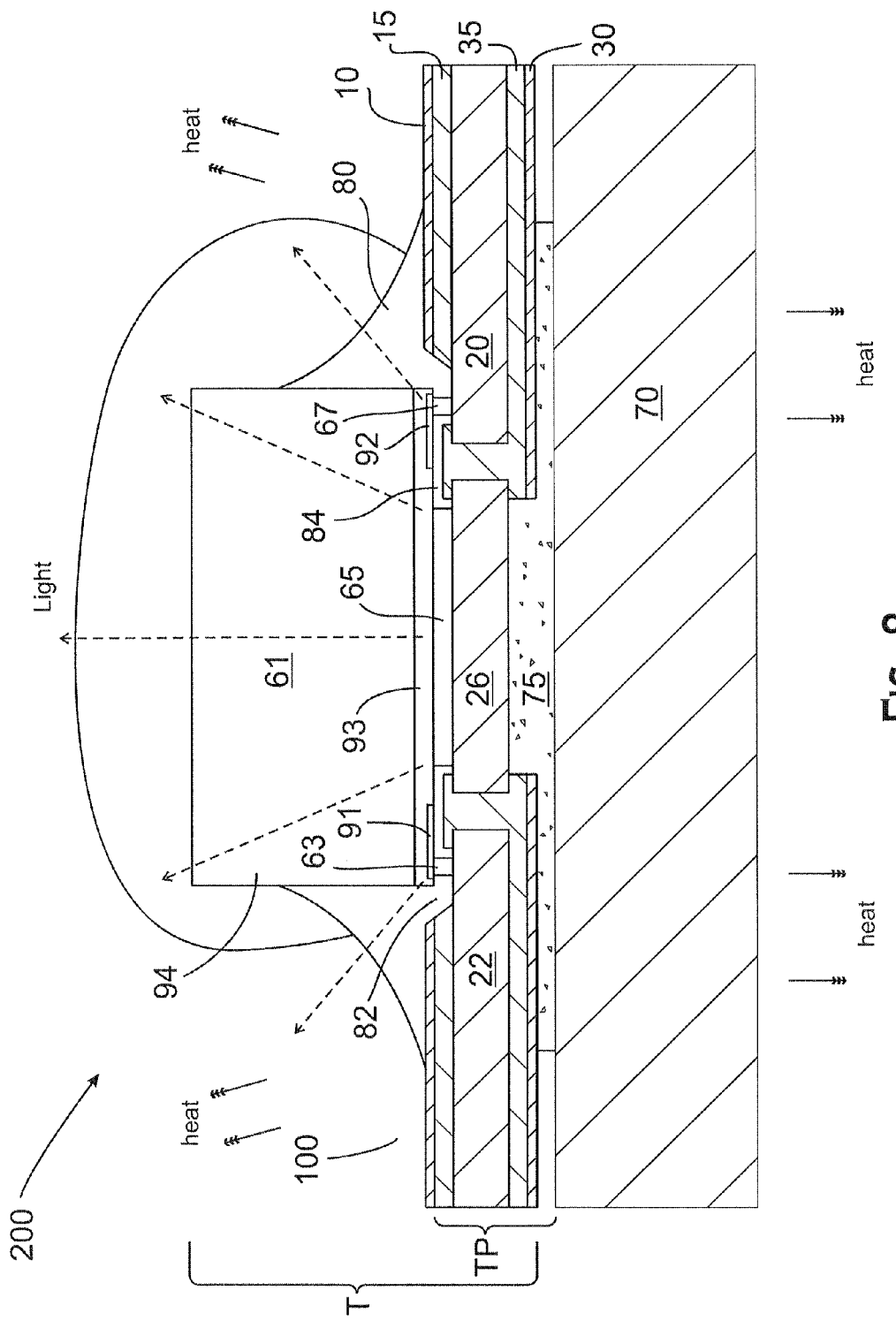
FIG. 8 depicts a close-up side cross-sectional view of a light-emitting diode bare die that has been embedded into a flexible printed circuit consistent with the first aspects of the present invention.

FIG. 8 shows a cross-sectional view of a light emitting diode in the bare form of a die 61 that has been attached to flexible printed circuit 100 without an additional casing, or packaging, unlike the variant shown in FIGS. 6-7. LED die 61 is made of an optically transparent substrate 94 and semiconductor diode structure 93, with wiring 91 for the cathode and wiring 92 for the anode. Island 26 and conductive traces 20, 22 have been formed by fine photolithography patterning allowing pitches between conductors down to 70 μm. Encapsulant 80 is arranged in spaces 84, 82 at the sides of die 61 to protect it. Moreover, it is also possible to cover die 61 with a glob top 98 as a stiffener and protective material, to avoid die chipping, and a color filter for the LED. Thinner than the assembly 200 of FIG. 7 explained above, this bare chip assembly of FIG. 8 with LED die 61 is designed such that the overall thickness T of the assembly is below 0.85 mm, instead of 2.3 mm as would be the case with a packaged component. It is possible that even thinner assemblies may be produced, for example by eliminating thermal conductive layer 70. The thickest component of assembly 200 shown in FIG. 7 is the packaged LED component having a thickness of 1.84 mm, but the assembly of FIG. 8 uses an LED die 61 that can be 0.35 mm or thinner. The next thickest component in FIG. 8 is Al heat sink 70 at 0.28 mm. Flex 100 is thinnest shown in FIG. 8 at 0.15 mm.

Moreover, in FIG. 8 the short thermal path TP is depicted as extending from the bottom of the LED diode structure 93 where light and waste heat is created by the forward voltage of the diode, to thermal conductive layer 70 that serves as a heat sink and heat spreader to conduct and radiate thermal energy out into the environment. Preferably, thermal path TP has a length in a range of 140 μm to 200 μm, because junction is at the bottom of die 61 for semiconductor diode structure 93. The largest component of thermal path TP is the metal thickness of 72 microns. To further reduce the heat resistance through this path, it is possible to use island 26 having a large surface that extends in x and y directions to faun a copper surface area that is larger than a surface area of die 61, and thereby thermal connections 75 can be made with a larger cross-sectional surface, so as to spread and dissipate waste thermal energy through circuit 100 into thermal conductive layer 70.

In the variant shown, thermal energy is most effectively dissipated through island 26. In addition, thermal energy is also dissipated in different directions, and thermal energy dissipates through both anode and cathode joints into pads 22 and 20. Furthermore, heat can also dissipate in the z-axis direction through optically transparent substrate 94. The surface area of island 26 relative to surface area of die 61 is chosen to be high, about 65%. Heat dissipates through both anode and cathode joints plus from the top of die 61 to a second heat sink (not shown), and the effective heat dissipation surface area summing all directions can become greater than 100% of the surface area of the die 61 in the x and y directions. Also, the fact that assembly 200 is very thin allows heat dissipation from both sides of assembly. The small size of die 61 relative to die thicknesses, typically about 170 μm for LED chips, allows heat to dissipate from all six (6) sides of the LED, thereby radiating heat more efficiently than conventional chips that usually have single surface heat dissipation.

Flexible circuit assembly 200 as produced by the foregoing method has certain advantages and features that are not currently found in the art. First, the flexible circuit assembly 200 is ideal for power electronics such as light emissive devices and power transistors because it can dissipate a high amount of power per flexible printed circuit surface without the need for any active cooling of the components 60 or bulky external radiators due to the already built-in thermal conductive layer 70 serving as a flexible and thin heat-sink layer. Second, it is desirable to divide a larger die power transistor into many smaller die sizes that are operated in parallel. The splitting-up into smaller dies and the embedding of them into circuit 100 allow better distribution of thermal power over a larger surface area to decrease power density and to avoid local overheating. Third, without packaging materials associated with component 60 that add to thermal resistance, heat dissipates from die 61 much faster. Fourth, the disclosed structure can conduct heat out from both the top and bottom surfaces of the die, and conduct heat out from even the die side edges, as the four edge surface areas of a small die can be about 1.9 times larger than the die 61 surface area. Thus, the total heat conducting surface area can become close to 400% larger, as compared with the die 61 bottom surface area.

A combination of many features of flexible circuit assembly 200 provide for these strongly improved power dissipation and high temperature features, including the short length of thermal path TP from the heat-generating area of die 61 to the thermal conductive layer 70, the very low thickness T of assembly 200 that allows heat dissipation on both sides of the assembly, the low-cost and thin flexible printed circuit 100 that allows design of an assembly 200 having a large surface layout for low power density concentration, and the choice of special heat-resistant materials, for example for the first and second insulation layers 10 and 30, the adhesive layers 15 and 35, the high-temperature characteristics of the solder connections 63, 65, 67, the encapsulant 80, and the underfill material for spaces 82, 84.

Other features that can result from the disclosed subject matter include the choice of components 61 that are preferably devices capable of operating reliably at high temperatures, such semiconductor or resistor materials as but not limited, to GaN, InGaN light-emitting diodes, and silicon carbide (SiC), the use of unpackaged dies 61 to improve heat transfer to the exterior, the use of materials with high thermal conductivity, a design for serpentine interconnections, metal joints 63, 65, 67, island 26, thermal connections 75, and thermal conductive layer 70 that increases cross-sectional area along a thermal path TP to provide low thermal resistance, and excellent electrical interconnection of these elements, so that an overall heat or thermal resistance between die 61 and the environment is minimized. Materials having excellent thermal properties for metal joints 63, 65, 67 can be Gold (Au) Tin (Sn), or eutectic bonding materials that can resist temperatures over 300° C. Other thermally good metal joint materials can be used, for example but not limited to, SnAg, SnSb, SnCuAg, SnZn, and Zn. The insulation layers 10 and 30 can be formed from high-temperature polyimides that can operate at 430° C. for long periods of time. For encapsulant 80, special optically transparent silicone-based encapsulants can be used next to LED die 61. Silicone has a Young's Modulus of about 2.5 GPa. Further, phosphor particles may be mixed into silicone. Also, encapsulant 80 can be selected so that the coefficient of thermal expansion (CTE) is matched with that of circuit 100. For other power semiconductors or resistors, opaque and thermally conducting material can be used around die 61.

Preferably, all of these factors taken in combination allow one to manufacture an assembly 200 that allows operating temperatures of 250° C. without destruction of the assembly 200. More preferably, operating temperatures of up to 300° C. can be achieved. The use of InGaN semiconductors allows an increase in the operating temperatures of assembly 200 so that it can operate at a 150° C. maximum junction temperature (TjMax) instead of that of 125° C. for Si. Moreover, with SiC semiconductors, the chip can be operated at even higher temperatures, for example, up to 250° C. With hotter junction temperatures, heat will dissipate faster through the films and heat sink 70 naturally by conduction. It is therefore possible to dissipate 100% more thermal power by raising TjMax for power applications operating at a high ambient temperature of 95° C. Such hot operating temperatures are not possible when FR4 PCB is used.

A thermal power dissipation density per surface that can be handled by assembly 200 can also be maximized, so that a maximal thermal power dissipation density per surface area can be up to 300 W/cm$^2$. Using AuSn eutectic joints, thermal resistance parameters including junction-to-case (theta-JC) is limited mostly by the thermal connection elements 75 and the material chosen. High thermal power dissipation density is possible especially if SiC power transistors and diodes are operated having a TjMax over 200° C. and if the ambient temperature of 40° C. is maintained, for example when the heat sink 70 is a sheet metal of a vehicle. Also, in addition to heat sink 70, it is possible to arrange a second heat sink layer on the upper surface of assembly 200, and with such double-sided heat sink structure the entire assembly 200 can be submerged into a liquid coolant such as radiator fluid, thermal energy evacuation from the surface of heat sink 70, and the additional upper heat sink layer is strongly increased. Inside circuit 100, it is also possible to use multiple dies instead of one die as a power transistor or power diode, operated in parallel, to spread the smaller power devices across 1 cm$^2$ surface area to dissipate up to 300 W.

This calculation of the maximal thermal power dissipation density per surface area is based on an assumption of the following dimensions, materials, and components: conductive layer elements 20, 22, 26 having a thickness of 72 μm made of Cu; insulating layers 10, 30 having a thickness of 13 μm made of polyimide; adhesive layers 15, 35 having a thickness of 25 μm; LED die 61 having a thickness of 335 μm, a surface area of 700 mm to 700 mm; LED die 61 having an optically transparent substrate 94 made of SiC; connections 63, 65, 67 having a thickness of 28 μm and being made of AuSn eutectic bonds; thermal connections 75 being made of thermally conducting, no pump-out, electrically insulating grease having a thickness in a range of 50 μm to 100 μm and having a conductivity of 3.6 W/m-K specified by manufacturer LORD; grease material for thermal connections 75 filling first openings between island 26 and heat sink 70 with no voids; grease material of thermal connections 75 being spread over a large surface between second insulating layer 30 and thermal conductive layer to have at least ten (10) times the surface are as compared to the surface area of the cross-section of thermal connections 75 at second openings 40 by pressure onto heat sink 70; grease contact area to islands 26 being larger than die 61 area by about 50%, and surface of islands 26 being larger than surface of die 61; and conductive traces 20 and 22 dimensions having a width such that they are able to support 1 A current, and having a width of 600 μm.

Figure 9:
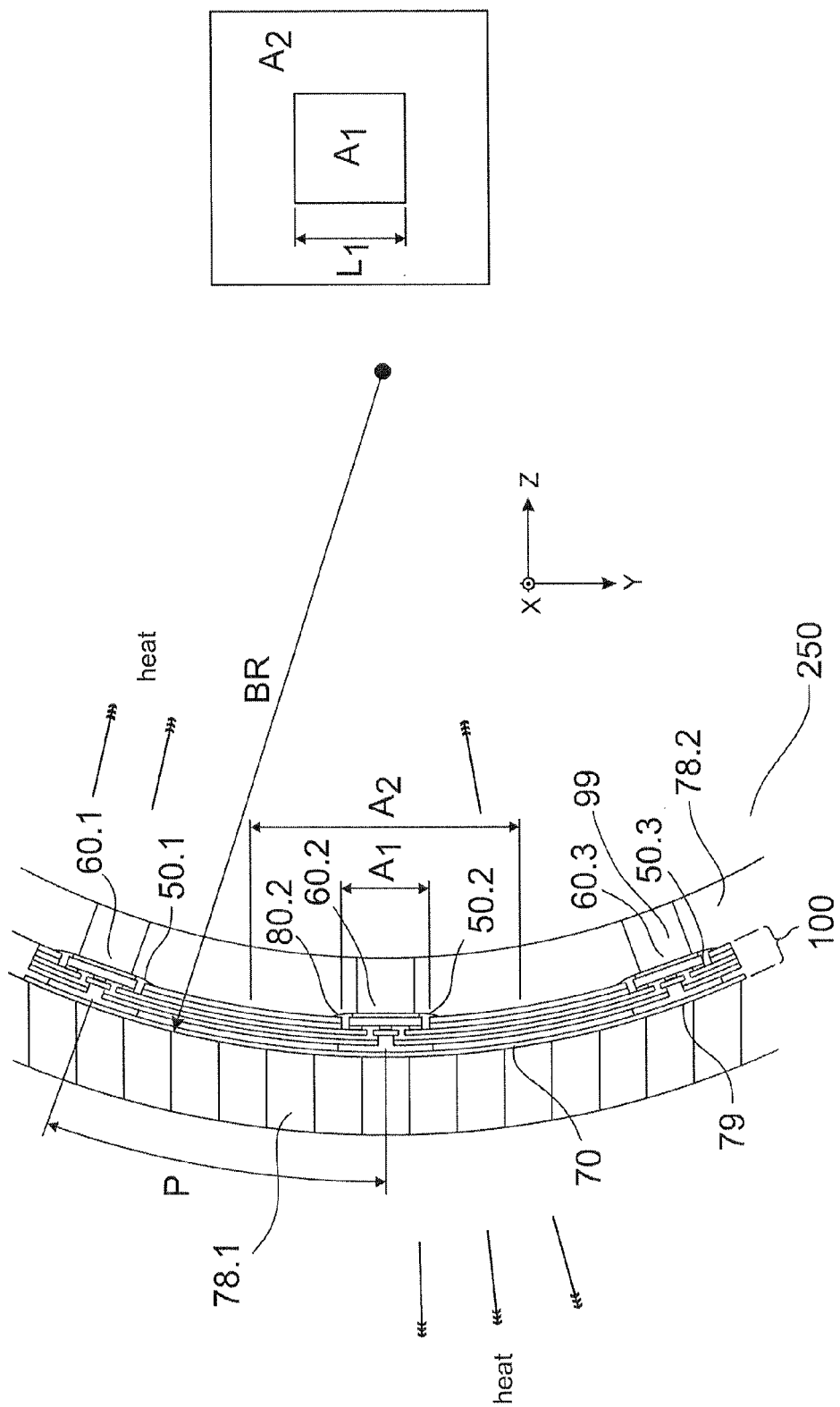
FIG. 9 depicts a side cross-sectional view of a flexible printed circuit assembly that has been installed on a curved surface according to another aspect of the present invention.

Another advantage of flexible print circuit assembly 200 for use with electronics with high power dissipation is the fact that due to its flexibility, assembly 200 can be installed easily at many locations where curved, bent, undulated, or other uneven surfaces are naturally available as cooling surfaces, so that the use of additional components can be minimized. In this respect, FIG. 9 depicts a cross-sectional view of a flexible printed circuit assembly 250 that is attached to a curved device 78 having a bending radius BR according to another embodiment aspect of the present invention. Assembly 250 is equipped with three components 60.1, 60.2, and 60.3 that are attached to the concave surface of curved device 78.1 via an adhesive film 79 or other bonding layer between thermal conductive layer 70 and curved device 78.1.

This installation or attachment of assembly 250 to a curved surface is not limited to assembly 250; of course assembly 200 of FIGS. 7-8 could be installed the same way. For example, curved device 78.1 could be the sheet metal of a vehicle body that is curved, a stamped casing part, curved glass windows, and assembly 250 could be a power electronics inverter/converter that provides electric power to an actuator or motor of the vehicle. As the vehicle body can be exposed to cooling air or water just by being moved in the environment, it can serve as a heat sink without the need for additional cooling by other elements. As another example, a battery charger could be implemented by assembly 250 and could be attached to a curved casing, for example but not limited, to a smart phone, a tablet computer, a personal computer, or a global positioning system (GPS) device, instead of using external power supplies. Yet another example is the integration of a power inverter into a tubular surface of a mast of a wind power generator, thereby taking advantage of the inherently curved inner surfaces of such masts, often having a diameter around 1 m or less. These masts are exposed to the wind and therefore are ideal as a cooling surface.

Also, in a variant, assembly 250 can be sandwiched inside two metal sheets as curved or bendable devices 78.1 and 78.2, for example, metal sheets made of Al. Electronics can be formed as integral parts of sheet metal parts, for example housing of electric motors, automotive body, etc. Assembly 250 could be coated on both sides with thermal grease or a thermally conductive adhesive so that thermal energy could be conducted from components 60.1, 60.2, 60.3 to a heat sink formed by the two metal sheets 78.1 and 78.2 on both sides of assembly. For example, lower surface of second insulating layer 30 and first openings can be covered with a thermally conductive adhesive or grease, and upper surface of first insulating layer 10, components 60.1, 60.2, 60.3, and encapsulant can be covered with a thermally conductive adhesive or grease. Then, two metal sheets 78.1 and 78.2 can be pressed with circuit 100 between so that air gaps and voids are removed from thermally conductive adhesive or grease. This double-sided heat sink with metal sheets 78.1 and 78.2 can be welded at the edges to form a sealed and near-hermetically closed casing that can protect against salt, stones, acid rain, humans peeling film or bending the structure beyond limit, electrical hazard, rodents, and for forming a Faraday cage for excellent electro-magnetic shielding. For this purpose, to fully enclose circuit 100 to form a continuous weld around all the edges, the circuit 100 can be cut from tape, and the x- and y-direction expansion of metal sheets 78.1 and 78.2 cab be chosen to the larger than the x- and y-direction expansion of circuit 100. The maximal permissible bending radius can be a range between 30 mm to 500 mm. With improved manufacturing technologies, small-sized components or dies 61, ultimately, bending radii with sizes down to 1.2 mm can be achieved, allowing novel applications, such as medical catheters.

For the embedding of LEDs, openings 99 at the locations of components 60.1, 60.2, and 60.3 can be provided in Al sheets. This encapsulation of components 60.1, 60.2, and 60.3 between Al sheets provides for good dielectric protection when operating the circuits at 300V or more. Also, the combination of the thin flexible printed circuit 100 with thin components 60.1, 60.2, and 60.3 and metal sheets 78.1 and 78.2 on both sides of circuit 100, an encapsulated structure can be created that can be submerged into water or other cooling liquid. Heat can dissipate from both sides of assembly 250 as indicated by arrows on FIG. 9. In addition to provide a heat sink structure by metal sheets 78.1 and 78.2 that have their side walls connected together, for example by welding, is the provision of EMI shielding for circuit 100 that is fully enclosed therein, without the need of a separate conductive casing for EMI shielding in addition to a heat sink structure.

Another advantage of the present invention is the creating biocompatible flexible printed circuit assemblies. For example, for the first and second insulating layers 10, 30, a special paper material that can be biodegraded, and adhesive layers 15, 35 can be made of biodegradable materials, such as starch-based biodegradable Polymers or Polyvinyl alcohol (PVOH). Not only are these materials biodegradable, but they are also very inexpensive, as compared to glass-reinforced epoxy laminate sheets such as FR4 that are used for rigid printed circuit boards (PCB). Also, no plastic packaging is involved, so that soldering connections can easily be removed by heating. This allows removal of first and second insulating layers 10, 30, adhesive layers 15, 35, and connections 63, 65 from conductive layer 20 that is usually made of copper (Cu), and dies 61 are also removed. Conductive layers 20 can be molten again to recycle the copper after the end of a product life.

In the embodiment shown in FIG. 9, surface area $A_1$ is defined as an area of assembly 250 that is covered by component 60.2 including encapsulant 80.2 and second opening 50.2. Surface area $A_2$ is defined as an area that surrounds the component 60.2, the border of $A_2$ being defined as being half way between two adjacent components 60.1 and 60.2. The right side of FIG. 9 shows a top view in the negative z-direction of these surfaces $A_1$ and $A_2$. Also, a pitch P is defined as being a distance from a center of two adjacent components 60.1 and 60.2. If components are used that dissipate a large amount of power, surface area $A_2$ can be increased by increasing pitch P between components, so that the power dissipation density per surface area meets the specific design of assembly 250. Further, for fitting assembly 250 to a relatively small bending radius BR, in a case where components 60.1, 60.2, 60.3 have a rectangular footprint, openings 50.1, 50.2 and 50.3 in flexible printed circuit 100 can be formed such that the narrower side of components 60.1, 60.2, 60.3 is exposed to the bent inner surface in the y-direction of curved device 78, and therefore the minimal bend radius of assembly 205 is reduced. In the variant shown in FIG. 9, a longitudinal expansion of components 60.1, 60.2, 60.3 would be oriented to be parallel with the x-direction. Instead of increasing pitch P, surfaces area $A_1$ can be reduced by dividing a large power chip into many smaller components 60.1, 60.2, 60.3. Many small chips can be cheaper for manufacturing and can dissipate more power per unit area than a single large chips for the same overall power. Also, the use of smaller chips may increase bendability of assembly 250.

Figure 10:
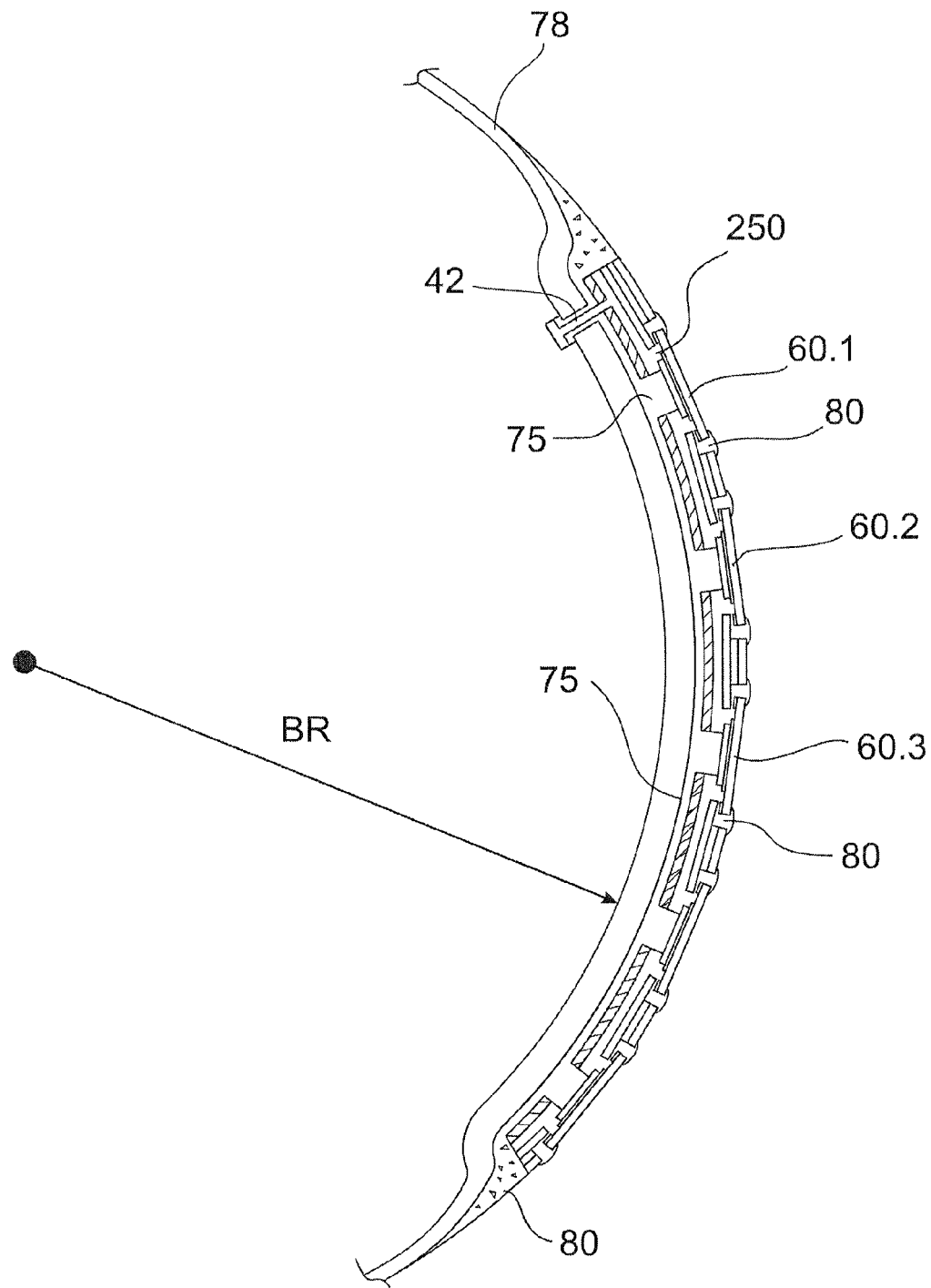
FIG. 10 depicts a side cross-sectional view of a flexible printed circuit assembly that has been installed on another curved surface according to yet another aspect of the present invention.

FIG. 10 shows still another aspect of the present invention, showing a cross-sectional view of flexible printed circuit assembly 250 that is attached to a curved device 78, but in this configuration an area where components 60.1, 60.2, 60.3, are located is the convex surface so that assembly 250 is stretched and not compressed as shown in FIG. 9. If Also, assembly 250 is directly adhered to curved device 78 without the use of thermal conductive layer 70, but by using a thermally conductive adhesive 75 to fill second openings 40 and to attach second insulating layer 30 directly to curved device 78 having bend radius BR, for example sheet metal of an automotive body. This embodiment allows a further material cost and processing step reduction, because no thermal conductive layer 70 is used. In addition, this embodiment allows further reduction of thermal resistances from components 60.1, 60.2 etc. to the curved device 78 that serves as a heat sink. Also, assembly 250 is provided with a post 42 that can have been manufactured in conventional ways on flexible printed circuit 100 that allows provision of electric signals and electric power to the assembly from the inner side of the curved device. The example shown in FIG. 10 could entail attaching LED-based lightings in a low-cost way to the body of a car or truck, for example but not limited to blinker lights, tail lights, interior lighting. In this variant, the assembly 250 is not bent repeatedly, so that a thermally conductive adhesive 75 that will harden can be used for attachment purposes. Also, the regions $L_2$ can be bent around angles with 90° corners, bent around edges by 180°, or can form 360° curls so that additional connectivity elements are not required between portions of assembly 250 on different sides of a mounting substrate.

If the bending angle BR for final installation of assemblies 250 shown in FIGS. 9 and 10 is known in advance, or if it is known whether the final application will be concave or convex, it is possible to manufacture assemblies 250 based on tapes 90 or flexible printed circuit 100 in a roll having a roll radius being in similar range to BR of the final application. For example, given that the roll has a shorter inner roll radius and a longer outer roll radius, rolls for tapes 90 or flexible printed circuit 100 can be chosen such that the BR lies somewhere between the shorter inner roll radius and the longer outer roll radius. Moreover, it is also possible to assemble components 60.1, 60.2, 60.3 on the concave or convex surface of tape 90, also depending on the placement of the final application. This allows to take advantage of the already present curvature of tapes 90 or flexible printed circuit 100 and the pre-bent shape, and will strongly reduce bending stresses to which the final application will be subject to.

Figure 11:
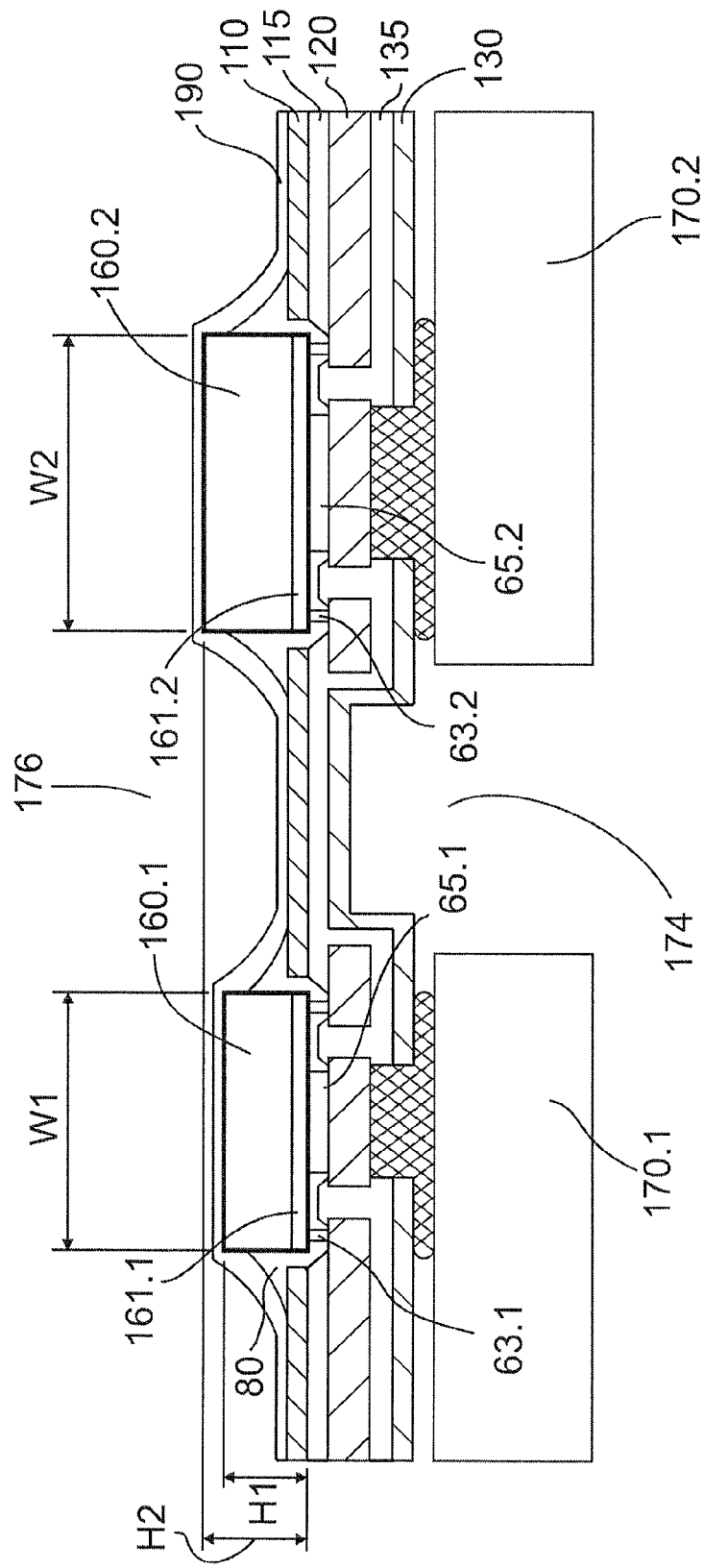
FIG. 11 depicts a side cross-sectional view of a flexible printed circuit assembly according to still another aspect of the present invention.

FIG. 11 illustrates yet another aspect of the present invention, showing an assembly having first and second components 160.1, 160.2 having different dimensions, in the variant shown having heights $H_1$ and $H_2$ that are different from each other, and widths $W_1$ and $W_2$ that are different. Also, to reduce weight of flexible printed circuit assembly 300 as well as the amount of material used to save costs, an open space 174 is formed to make a first and a second thermal conductive layer 170.1 and 170.2. This feature allows to insulation of individual heat sinks from each other, formed by first and second thermal conductive layers 170.1, 170.2, if they have to operate at different temperatures, or if they are connected to different voltage potentials. Moreover, an opening as a bendable region 176 is formed between first conductive layer 120. Also, for insulating components 160.1, 160.2 and for protecting them, a protective cover layer 190 can deposited over assembly 300 that may also have high thermal conductivity. Cover layer 190 can protect components 160.1, 160.2 if assembly 300 is operated submersed in water or other cooling liquid.

In addition, solder connections 63.1 and 65.1 can be made of a solder material having a different melting point temperature than solder connections 63.2 and 65.2. For example, component 160.2 can be soldered first due to certain process limitations, and therefore solder material used for solder connections 63.2 and 65.2 can be chosen to have a higher melting temperature than for solder material used for solder connections 63.1 and 65.1. Although FIG. 11 shows the first and second thermal conductive layers 170.1, 170.2 physically separated, it is also possible this layer can also be contiguous and have connections that are not shown in FIG. 11.

Figure 12A:
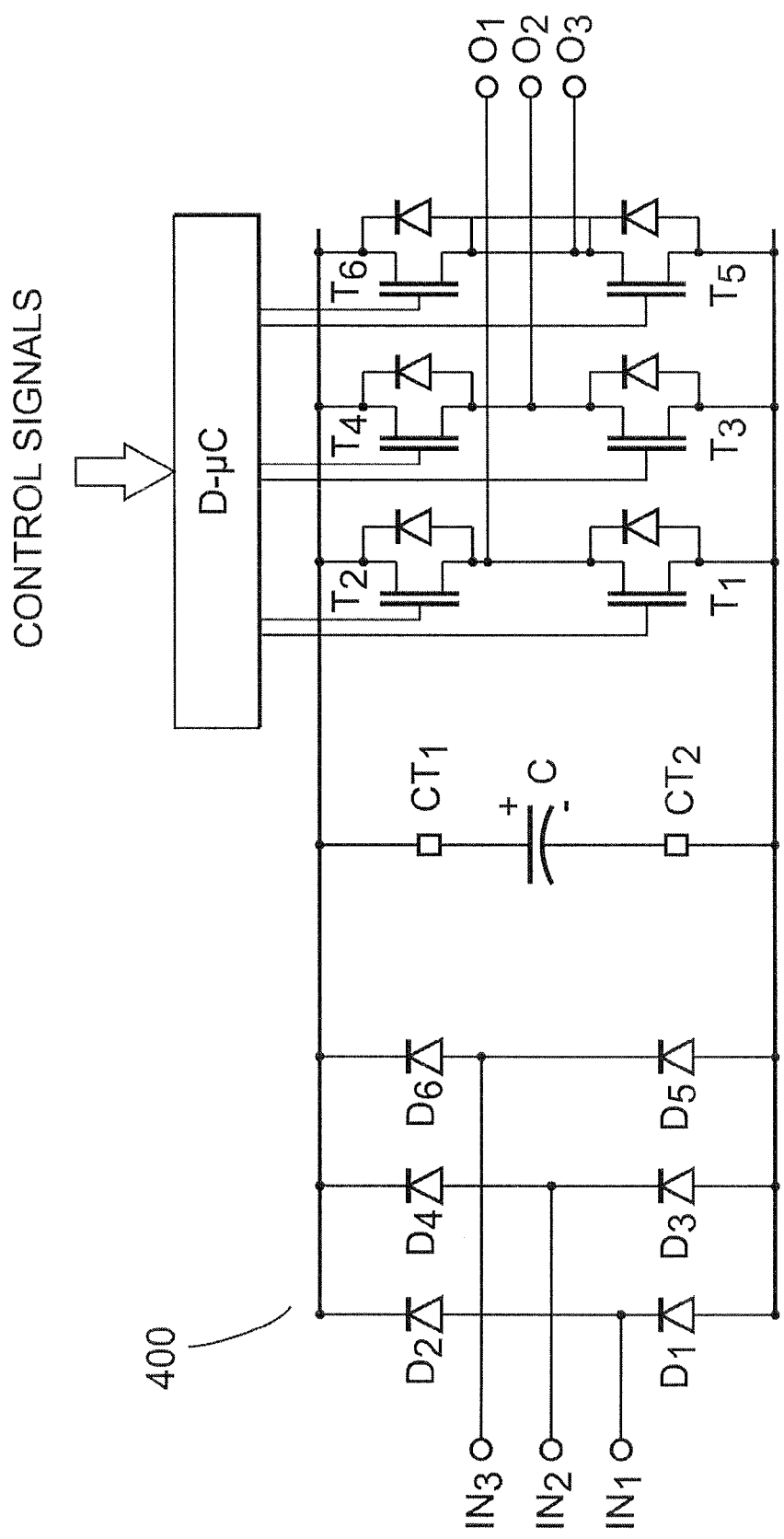
FIG. 12A depicts a schematic representation of a power electronics circuit and FIG. 12B depicts an exemplary implementation of said power electronics circuit as a flexible printed circuit assembly in a tape according to another aspect of the present invention.
Figure 12B:
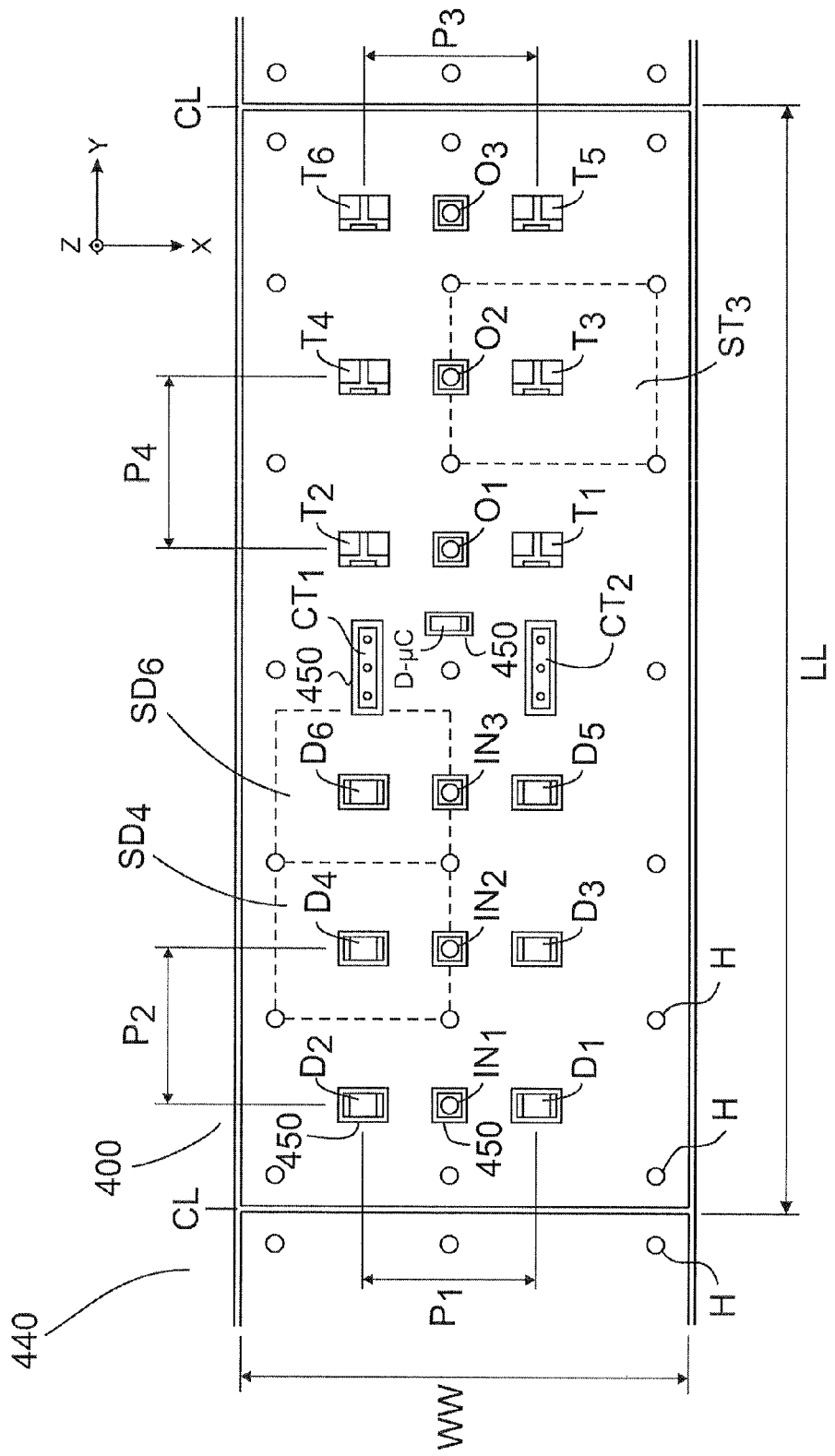

FIG. 12A shows a power inverter circuit including a full-bridge rectifier with diodes $D_1$ to $D_6$, a decoupling capacitor C, a three-phase inverter with power transistors $T_1$ to $T_6$ with the associated free-wheeling diodes, and transistor driver and controller circuit D-μC, and FIG. 12B shows a corresponding realization as a flexible printed circuit assembly 400 according to another aspect of the present invention. Assembly 400 can be manufactured by the method shown in FIGS. 1-7. In FIG. 12B, discrete power components such as diodes $D_1$ to $D_6$ and power transistors $T_1$ to $T_6$ that will dissipate a similar amount of power are spaced out equidistantly. For example, diodes $D_1$ to $D_6$ of the full-bridge rectifier are arranged by a pitch $P_1$ in an x-direction and a pitch $P_2$ in a y-direction that forms a grid with substantially equal distances between diodes $D_1$ to $D_6$, and power transistors $T_1$ to $T_6$ of the three-phase inverter are arranged by a pitch $P_3$ in an x-direction and a pitch $P_4$ in a y-direction that forms also a grid with substantially equal distances between power transistors $T_1$ to $T_6$. The pitches $P_1$, $P_2$, $P_3$, and $P_4$ can be chosen so that the flexible printed circuit can handle the amount of dissipated power, similarly as explained above with respect to FIG. 9. For example, pitches $P_3$ and $P_4$ can be chosen to be greater than pitches $P_1$ and $P_2$, because power transistors $T_1$ to $T_6$ that are operated with a pulse-width modulation (PWM) in a kilohertz frequency range usually generate more power losses than rectifying diodes $D_1$ to $D_6$ that are operating at a line frequency range of 50 Hz/60 Hz. Therefore, by adjusting the pitches, a ratio between surface areas $SD_1$ to $SD_6$ that are associated to diodes $D_1$ to $D_6$ and surface areas $ST_1$ to $ST_6$ that are associated to transistors $T_1$ to $T_6$, respectively, can be made proportional to the ratio of the power losses of diodes $D_1$ to $D_6$ and transistors $T_1$ to $T_6$, respectively, so that the generated heat is equally distributed over the entire surface of assembly. Also, surfaces areas $SD_1$ to $SD_6$ and $ST_1$ to $ST_6$ can be calculated to be sufficiently large to cope with the thermal energy that is generated by the corresponding discrete power device, to meet the maximal power dissipation per surface. The entire surface area of assembly 400, defined by width WW and length LL, can be determined based on the overall power losses of the power circuit in operation, and the maximal power dissipation per surface area of assembly 400, for example a range between 100 and 300 W/cm². Moreover, in a variant, power devices diodes $D_1$ to $D_6$ and transistors $T_1$ to $T_6$ are split into several devices of smaller power, but are connected in parallel, so that the power losses can be shared by several devices. This would allow to better spread out the power losses onto the surface area of assembly 400, to avoid local power dissipation hotspots that could lead to destruction.

Also, second openings 450 are formed to expose the components but also terminals for interconnection of flexible printed circuit assembly 400. For example, input terminals $IN_1$, $IN_2$, $IN_3$ are arranged substantially at half-distance in an x-direction on assembly 400 between the associated diode pairs $D_1$-$D_2$, $D_3$-$D_4$, and $D_5$-$D_6$, so that the conductive paths and parasite inductance are kept low. Also, output terminals $O_1$, $O_2$, $O_3$ are arranged substantially at half-distance in an x-direction on assembly 400 between the associated transistor pairs $T_1$-$T_2$, $T_3$-$T_4$, and $T_5$-$T_6$, Because the decoupling capacitor C is usually a device with high storage capacity and therefore has a much larger footprint than all the other components, and would reduce the bending capabilities if attached or embedded into assembly 400, and also may have to be replaced after a certain amount of operation hours, capacitor terminals $CT_1$, $CT_2$ are also exposed on upper surface of assembly 400 in a central area, and capacitor C itself is not embedded into assembly. Instead, capacitor C can be mounted to assembly 400 once put in a bent state. Transistor driver and controller circuit D-μC is also embedded into a second opening 450. Moreover, to securely attach assembly 400 to another device, such as a casing, curved surface, mounting holes H are provided on assembly 400. The mounting holes are spread out as a matrix-like fashion having substantially similar distances between each other. FIG. 12B also shows that adjacent to assembly 400, the same assemblies are arranged to form a tape of assemblies 440, delineated by virtual cutting lines CL. Once the assemblies 400 are formed, the tape of assemblies can be rolled for transportation and further manufacturing and testing, and at a later stage can be cut into individual assemblies 400.

Conventionally, the power electronic circuit shown in FIG. 12A has been implemented by integrating multiple chips of different technology on the same substrate or carrier having a common casing, for example by integrating complementary metal oxide semiconductor (CMOS) driver and controller circuit D-μC and metal-oxide semiconductor field-effect transistor (MOSFET) and equivalent diodes in the same casing, to be very close to teach other. Such packages are also called multi-chip modules or intelligent power modules. However, such technologies create a very high power density inside the packages and as a consequence require sophisticated cooling by large heat sinks or even active cooling systems that generate substantial additional costs in terms of components but also system integration. Assembly 400 permits a new manufacturing method and assembly that allows integration of different semiconductor chips and their respective different technologies and embed them in the same flexible circuit, without the need for packaging all of the chips. Large surfaces of the flexible printed circuit 100 can be manufactured cheaply, and power electronic semiconductor devices should not be packed densely, and should rather be spread apart to reduce power density, increase heat transfer rate, and minimize production costs.

Figure 13:
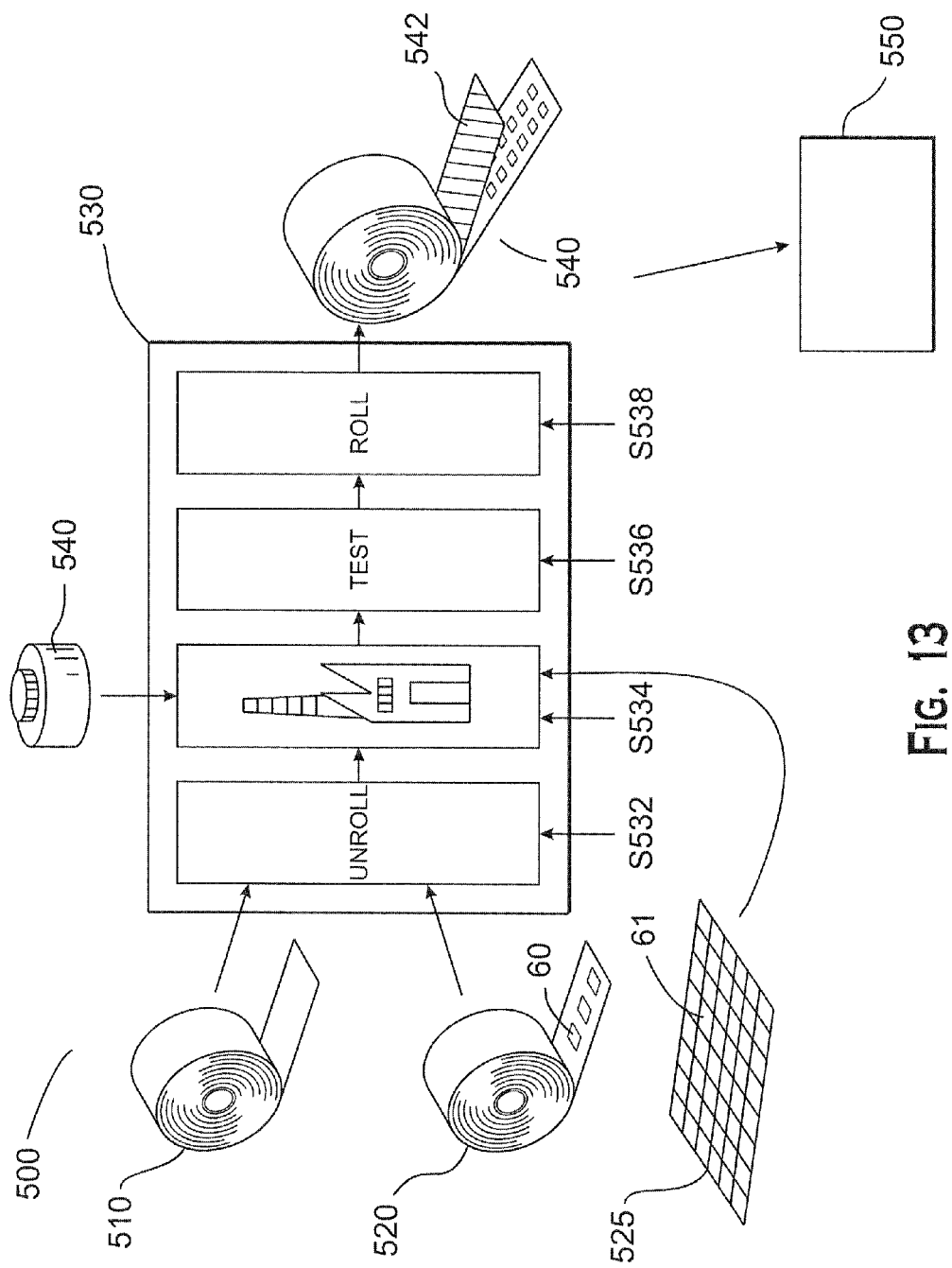
FIGS. 13-14 depict a schematic representation of a method and a system for manufacturing a rolled tape of multiple power electronics assemblies in a roll-to-roll manufacturing process according to yet another aspect of the present invention.
Figure 14:
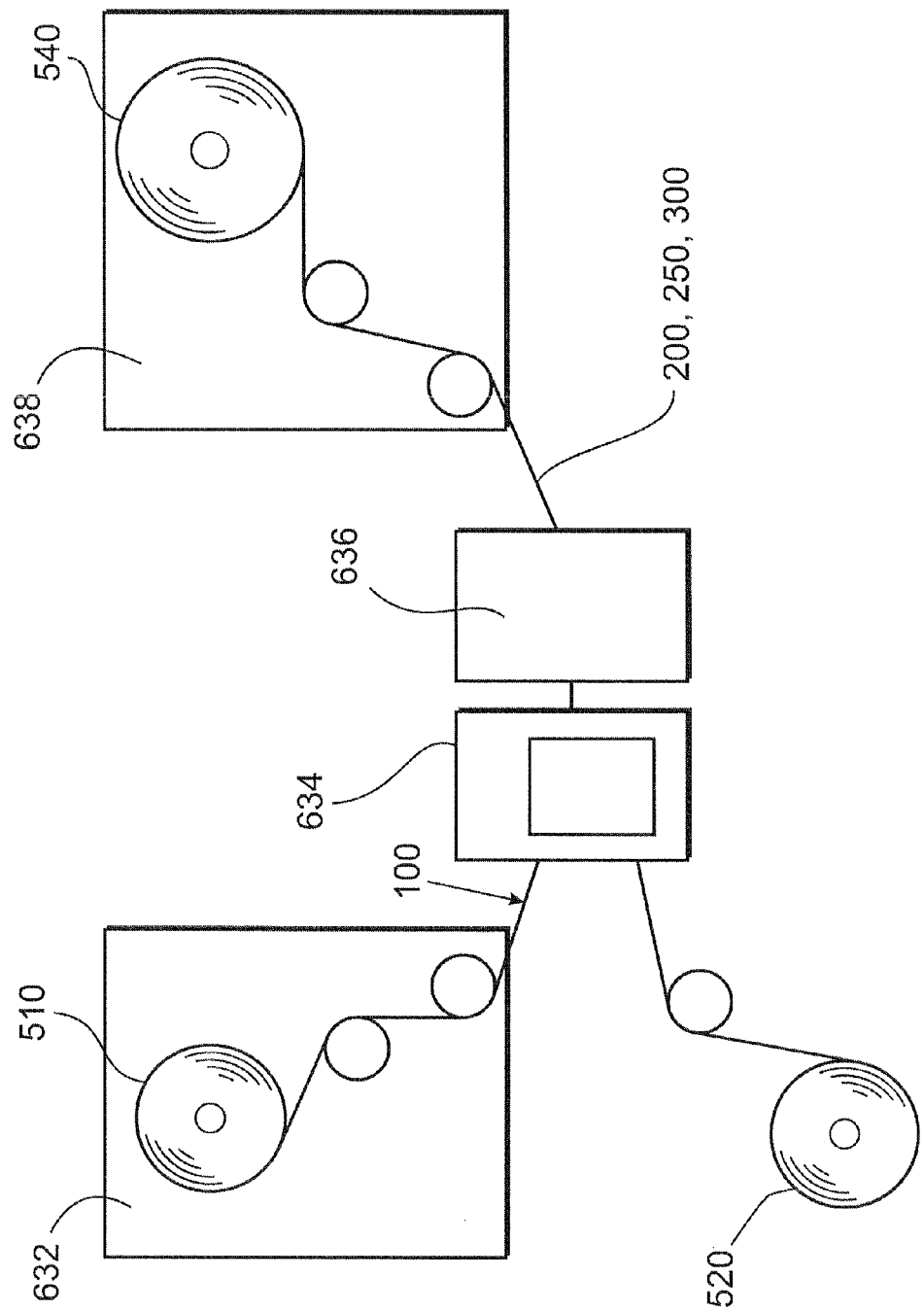

FIGS. 13-14 illustrates another aspect of the present invention, showing a schematic view of a method 500 (FIG. 13) and a system or facility (FIG. 14) of processing a rolled tape 510 of a flexible printed circuit in a roll-to-roll manufacturing concept. For example, the rolled tape 510 of the flexible printed circuit could be flexible printed circuit 100 as shown in FIG. 5, but in a rolled state having a length in the unrolled state that can accommodate a plurality of individual assemblies. Assemblies of rolled tape 510 can be any one of the examples discussed before, such as assemblies 200, 250, 300, 400. This method allows minimization of cycle time by performing roll-to-roll manufacturing, possible elimination of die/chip packaging into casings, and thereby avoidance of the use of lead frames that are used for packaging, and integrated testing on the rolled tape for further simplification of the manufacturing process.

In a variant, an unprocessed flexible printed circuit 90 as shown in FIG. 1, or with some pre-processing steps as shown in FIGS. 2-4, is provided continuously with rolled tape 510. In this method, by virtue of the flexibility of the assemblies, a rolled tape 510 of the flexible printed circuit, and also packaged components 60 or dies 61 that are rolled in a carrier tape 520 are delivered to processing facility 530 and are subjected to a step S532 in which the rolled tapes 510 and 520 are at least partially unrolled by a tape feeder 632 for further manufacturing. In addition, components 60 or dies 61 can be delivered in carrier strips or trays 525 to processing facility 530 and do not have to be unrolled. Next, the unrolled portions of tapes 510 and 520 are provided to manufacturing and processing step S534, in which a method of manufacturing a flexible printed circuit assembly can be performed as shown in FIGS. 1-7 by a flexible printed circuit equipment machinery 634 including a device that can place components or dies, or portions of this method of manufacturing. Strips or trays 525 and other components and materials 540 used for the processing method of step S534 can also be delivered to facility 530 without having to go through the unrolling step S532. Materials 540 for example but not limited to adhesives, encapsulant material, underfill material, thermal conducive grease or adhesives, processing gases, and cryogenics are available to processing step S534. The result of manufacturing and processing step S534 is a continuous band of flexible circuit assemblies 200, 250, 300, 400 for example as partially shown with FIG. 12B that are still attached to each other and can be rolled again. Rolled tapes 510, 520, and 540 can also be made to have a roll core with the same diameter for easy interchangeability.

For method 500, different processes require different equipment, for example but not limited to wet etching, rinsing tanks, mask alignment, UV exposure, baking, cutting, laminating, and probing. The roll-to-roll manufacturing line for method 500 can therefore become rather long. One aspect of method 500 can therefore also be the creation of smaller segmented lines to process photolithography, develop, soft bake and cure. The use of yellow light and chemicals sometimes requires having a roll-to-roll manufacturing line in a separate room separate from lamination, router cutting, robotic equipment like pick & place or electronic testers. This means that tapes can be unrolled and rolled up many times before all manufacturing processes are complete.

Next, processing facility 530 can perform electric and functional testing of assemblies 200, 250, 300, 400 while still being arranged in the continuous tape in a step S536 with test machinery 636. In this step, all the electrical connections can be tested via terminals or specially arranged test points, and functional testing can be performed on components 60 or dies 61 that have been embedded into the flexible printed circuit. For example, it would be possible to test power electronic components that are used as devices 60 and dies 61 together with a heat sink 70 that is already attached to flexible printed circuits, so that power devices can be fully tested to their full power range of the circuit design, before rolling assemblies 200, 250, 300, 400 for further processing delivery. Conventionally, power electronic modules are tested without heat sinks at a very low power and can therefore not be fully tested to their permissible power range, because overheating would destroy components 60 or dies 61. However, in a variant, it is also possible that no components 60 and dies 61 are embedded to flexible printed circuit 100 in step S34, but only flexible printed circuits 100 in a continuous band are produced by step S34, as shown in FIG. 5. In such a case, the testing could be limited to electrical testing of the connection traces 22 and surface inspections of islands 26, without any functional testing of components. Once assemblies 200, 250, 300, 400 in the continuous tape are sufficiently tested, they are provided to step of rolling 538 in which the assemblies 200, 250, 300, 400 in the continuous tape are rolled to an assembly roll 540 by a tape roller 638, without cutting out the individual assemblies, before further processing that can occur at a different facility. To avoid short circuits, dust, mechanical abrasion, and static electricity, a protective tape 542 can be wound into the assembly roll 540.

Assembly roll 540 can thereby be prepared and packaged to be ready for delivery to another entity or additional processing steps 550 for further processing and manufacturing. Assembly roll 540 includes a plurality of assemblies 200, 250, 300, 400 that are fully operable but still arranged along a tape and can be packaged into protection boxes for delivery. Also, as shown in FIG. 14, the flexible printed circuit 100 in a continuous band from roll 510 is never cut during the processes, and is transformed by steps S534 and S536 into fully operational but unpackaged power electronic assemblies 200, 250, 300, 400 in a continuous band to form roll 540. As shown in Provisional Application with Ser. Nos. 61/630,536 and 61/693,195, these patent applications being incorporated by reference herein their entirety, it is also possible to introduce embedded flexible inductors having a flexible magnetic sheet as a core into assemblies 200, 250, 300, 400 for further integration of passive components. Assembly rolls 540 are not yet cut into individual units and assemblies 200, 250, 300, 400 are not further packaged other than the presence of protective tape 542, so that the flexibility for rolling is preserved.

Method 500 allows for continuous production and testing of flexible power devices that can be manufactured at very low cost, for example but not limited to light-emitting-diode assemblies, power inverters and controllers for automotive industry, battery chargers for mobile devices, power inverter circuits for induction motors for elevators and wind power generators, and light-emitting-diode based large scale display screens. Assemblies 200, 250, 300, 400 are made of a single conductive layer 20 for the electrical signals and power supply for simplifying the circuit design and complexity. Because the method 500 as described in FIG. 12 can be implemented as a fully automated manufacturing process for mass-production, manufacturing costs related to any human operation can be minimized, and the overall manufacturing costs will be determined by the operation costs of the equipment and the premises that contain the equipment, permitting competitive manufacturing in countries with high human labor costs. As an additional example, due to the flexibility of assemblies 200, 250, 300, 400, it is also possible to manufacture power electronic devices that have to be subjected to repeated bending, such as electronic circuitry for driving actuators and motors or controlling sensors for robotics, prosthesis, or to provide heating elements or mobile device controllers for clothing.

While the invention has been disclosed with reference to certain preferred embodiments, numerous modifications, alterations, and changes to the described embodiments are possible without departing from the sphere and scope of the invention, as defined in the appended claims and their equivalents thereof. Accordingly, it is intended that the invention not be limited to the described embodiments, but that it have the full scope defined by the language of the following claims.

The invention claimed is:

1. A flexible circuit assembly for accommodating a plurality of power electronic devices, comprising:
  an insulating cover layer having first openings, the first openings configured to receive the plurality of power electronic devices at least partially inside the first openings;
  a flexible conductive layer arranged under the insulating cover layer and attached with a first adhesive to the insulating cover layer, the flexible conductive layer having a plurality of islands and conductive traces, the first openings arranged above the islands;
  an intermediate insulating layer arranged under the flexible conductive layer and attached with a second adhesive to the flexible conductive layer, the intermediate insulating layer having second openings, the second openings arranged below the islands;
  a plurality of heat-conductive elements arranged inside the second openings;
  a first thin heat sink layer, the heat-conductive elements arranged to be in contact with an upper surface of the thin heat sink layer and the lower surface of the islands via heat-conductive material; and
  a second thin heat sink layer, upper surfaces of the power electronic devices arranged to be in contact with a lower surface of the thin heat sink layer and the lower surface of the islands via heat-conductive material,
  wherein the flexible circuit assembly is bendable to a bending radius of 3 cm without cracking the insulating cover layer, the flexible conductive layer, the intermediate insulating layer.

2. The flexible circuit assembly according to claim 1, wherein side edges of the first and the second thin heat sink layer are bonded together to form an encapsulating casing for the flexible circuit assembly.

3. The flexible circuit assembly according to claim 2, wherein the bonding of the side edges is made by welding.

4. A flexible circuit assembly for accommodating a plurality of light emitting diodes, comprising:
  an insulating cover layer having first openings, the first openings configured to receive the plurality of light emitting diodes at least partially inside the first openings;
  a flexible conductive layer arranged under the insulating cover layer and attached with a first adhesive to the insulating cover layer, the flexible conductive layer having a plurality of islands and conductive traces, the first openings being above the islands;
  an intermediate insulating layer arranged under the flexible conductive layer and coupled with a second adhesive to the flexible conductive layer, the intermediate insulating layer having second openings, the second openings being arranged below the islands;
  a plurality of heat-conductive elements arranged inside the second openings; and
  a thin heat sink layer, the heat-conductive elements being to be in contact with the upper surface of the thin heat sink layer and the lower surface of the islands,
  wherein the flexible circuit assembly is bendable to a bending radius of 3 cm without cracking the insulating cover layer, the flexible conductive layer, or the intermediate insulating layer.

5. A flexible light emitting diode assembly, comprising:
  a flexible circuit assembly according to claim 4;
  a plurality of light emitting diodes arranged to be at least partially inside the first openings; and
  a plurality of solder connections arranged between the light emitting diodes and the flexible conductive layer, the solder connections connecting a lower surface of the light-emitting diodes with the upper surface of the islands and the conductive traces,
  wherein the light emitting diode assembly is bendable to a bending radius of 6 cm without cracking the insulating cover layer, the flexible conductive layer, or the intermediate insulating layer.

6. The flexible light emitting diode assembly according to claim 5, wherein
  a thickness of the flexible light emitting diode assembly does not exceed 2.3 mm.

7. The flexible light emitting diode assembly according to claim 5, wherein remaining portions of the first openings are filled with an encapsulant to secure the light emitting diodes to the flexible circuit assembly.

8. A rolled tape of flexible light emitting diode assemblies, comprising:
  a plurality of flexible light emitting diode assemblies according to claim 5,
  wherein the plurality of flexible light emitting diode assemblies are attached to each other to form a tape that is rolled, with adjacent flexible light emitting diode assemblies being defined by a virtual cutting line.

* * * * *